(12) United States Patent
Toh et al.

(10) Patent No.: US 9,171,953 B2
(45) Date of Patent: Oct. 27, 2015

(54) FINFET WITH STRESSORS

(71) Applicant: GLOBALFOUNDRIES Singapore Pte. Ltd., Singapore (SG)

(72) Inventors: Eng Huat Toh, Singapore (SG); Jae Gon Lee, Singapore (SG); Chung Foong Tan, Singapore (SG); Elgin Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 106 days.

(21) Appl. No.: 13/947,118

(22) Filed: Jul. 22, 2013

(65) Prior Publication Data

US 2013/0307038 A1    Nov. 21, 2013

Related U.S. Application Data

(62) Division of application No. 12/980,375, filed on Dec. 29, 2010, now Pat. No. 8,492,235.

(51) Int. Cl.
*H01L 27/088* (2006.01)
*H01L 29/78* (2006.01)
*H01L 29/66* (2006.01)

(52) U.S. Cl.
CPC ........ *H01L 29/785* (2013.01); *H01L 29/66795* (2013.01); *H01L 29/7849* (2013.01)

(58) Field of Classification Search
CPC ............... H01L 29/66787; H01L 27/10879; H01L 27/10826; H01L 27/0886; H01L 21/823431; H01L 2029/7858
USPC ........... 257/300, E29.022, 401; 438/300, 127
See application file for complete search history.

(56) References Cited

U.S. PATENT DOCUMENTS

| | | | |
|---|---|---|---|
| 5,266,505 A | 11/1993 | Ahlgren et al. | |
| 6,900,502 B2 | 5/2005 | Ge et al. | |
| 2004/0217434 A1* | 11/2004 | Lee et al. | 257/412 |
| 2007/0241414 A1 | 10/2007 | Narihiro | |
| 2007/0290265 A1 | 12/2007 | Augusto et al. | |
| 2008/0073667 A1 | 3/2008 | Lochtefeld | |
| 2009/0001415 A1 | 1/2009 | Lindert et al. | |

* cited by examiner

*Primary Examiner* — Allen Parker
(74) *Attorney, Agent, or Firm* — Horizon IP Pte Ltd

(57) ABSTRACT

A fin type transistor includes a dielectric layer on a substrate surface which serves to isolate the gate of the transistor from the substrate. The dielectric layer includes a non-selectively etched surface to produce top portions of fin structures which have reduced height variations across the wafer. The fin type transistor may also include a buried stressor and/or raised or embedded raised S/D stressors to cause a strain in the channel to improve carrier mobility.

14 Claims, 40 Drawing Sheets

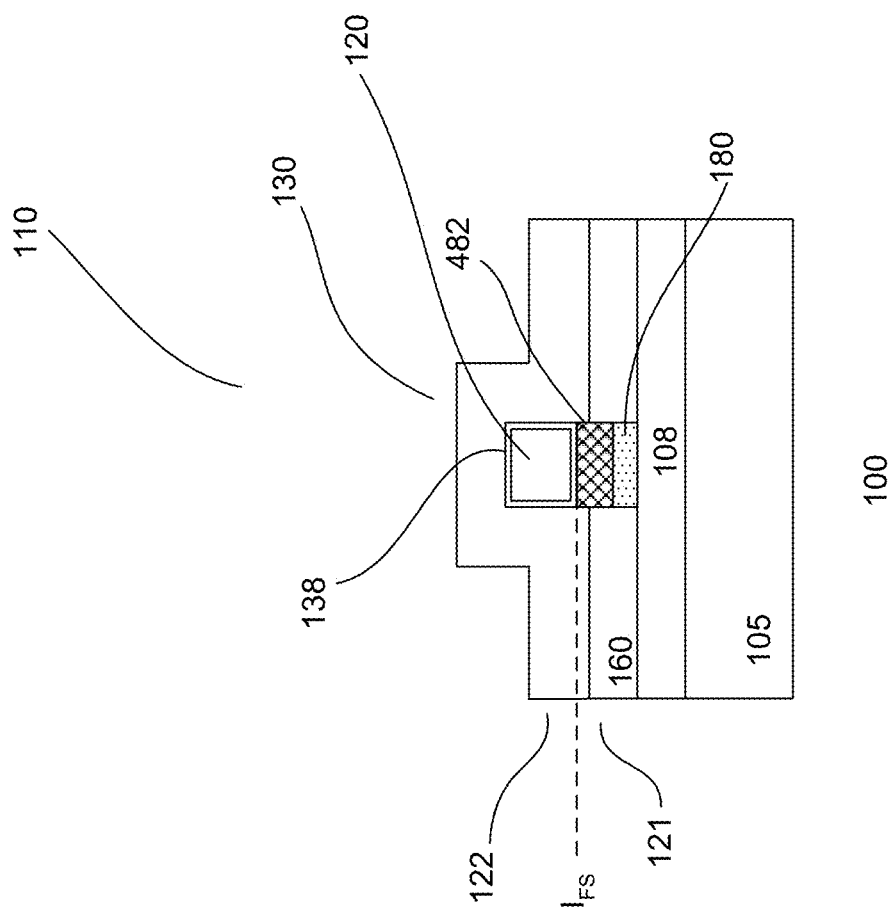

| NFET | Channel | Channel Stressor | S/D Stressor |
|---|---|---|---|
| A | Si | SiGe<br>SiGe:C<br>SiGeSn<br>Ge<br>GeSn | Si:C |
| B | SiGe | SiGe<br>SiGe:C<br>SiGeSn<br>Ge<br>GeSn | Si:C<br>SiGe |
| C | Ge | SiGeSn<br>Ge<br>GeSn | Si<br>SiGe<br>SiGeSn<br>GaAs |
| D | GaAs | Ge<br>GeSn | SiGe<br>SiGeSn<br>GaAs |

Fig. 6a

| PFET | Channel | Channel Stressor | S/D Stressor |
|---|---|---|---|
| A | Si | Si:C | SiGe<br>SiGe:C<br>SiGeSn<br>Ge<br>GeSn |
| B | SiGe | Si:C<br>SiGe | SiGe<br>SiGe:C<br>SiGeSn<br>Ge<br>GeSn |
| C | Ge | Si<br>SiGe<br>SiGeSn<br>GaAs | SiGeSn<br>Ge<br>GeSn |
| D | GaAs | SiGe<br>SiGeSn<br>GaAs | Ge<br>GeSn |

Fig. 6b

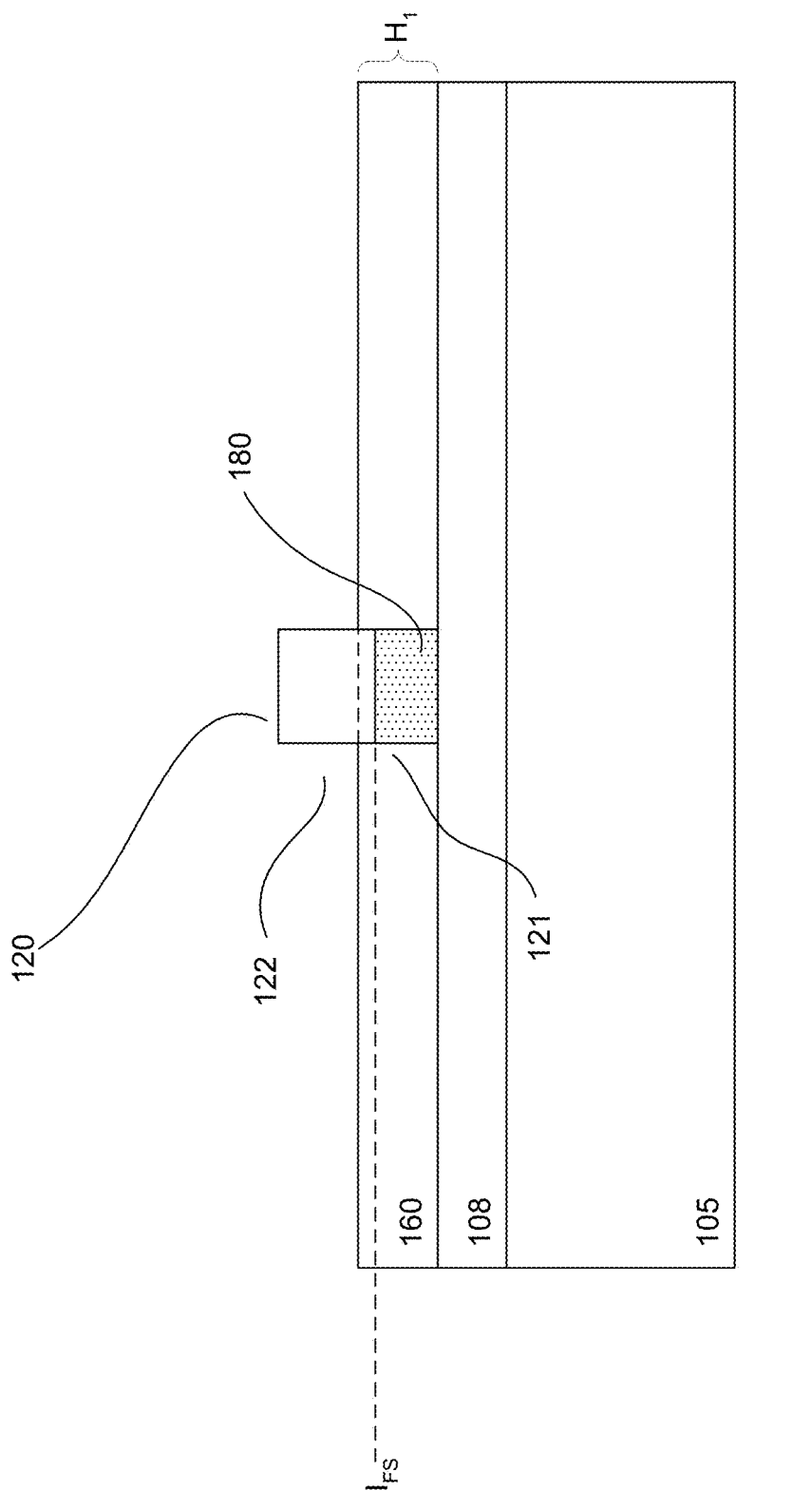

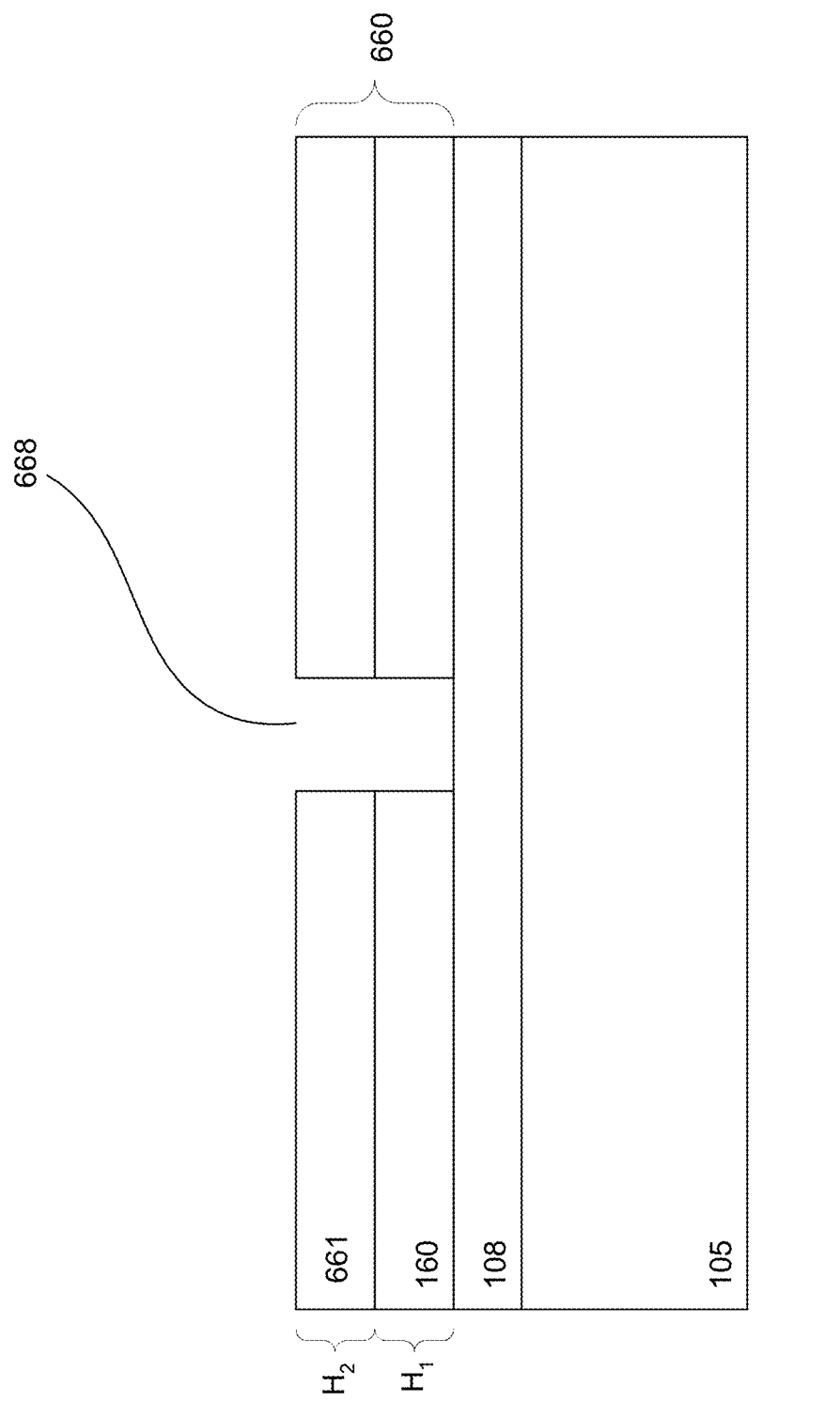

FINFET WITH STRESSORS

CROSS-REFERENCE TO RELATED APPLICATION

This application is a divisional application which claims benefit of copending U.S. patent application Ser. No. 12/980, 375, filed Dec. 29, 2010, which was concurrently filed with U.S. patent application Ser. No. 12/980,371 entitled "IMPROVED FINFET" (filed Dec. 29, 2010), which are herein incorporated by reference for all purposes.

BACKGROUND

Fin type transistors have been investigated for future generation of devices, such as for sub-22 nm technology. This may be due to, for example, the fact that fin type transistors are conducive to high integration density. However, conventional processes for forming fin type transistors result in large variations in height. This undesirably results in variations in device characteristics across the wafer, reducing reliability and yields. It is desirable to produce fin type devices with reduced height variations as well as enhanced performance.

SUMMARY

A method for forming a device is described herein. The method includes providing a substrate prepared with a device region which includes a doped isolation well and a dielectric layer over the substrate. The dielectric layer includes a second dielectric sub-layer over a first dielectric sub-layer. The method further includes forming a fin structure in an opening in the dielectric layer and removing the second dielectric sub-layer selective to the first dielectric sub-layer to leave a portion of the fin structure extending above a top surface of the first dielectric sub-layer. A gate which traverses the fin structure is formed and doped S/D regions are formed in the fin structure adjacent to the gate. A channel is disposed between the S/D regions below the gate. The method also includes forming a first stressor to cause the channel to have a first strain to improve carrier mobility.

In one embodiment, a device which includes a substrate prepared with a dielectric layer on its top surface is disclosed. The dielectric layer includes a non-selectively etched dielectric top surface. The device includes a fin structure disposed on the substrate in the dielectric layer. The fin structure includes a bottom portion and a top portion, the top portion extending above the non-selectively etched dielectric top surface. The top portion determines a device height and the non-selectively etched top surface reduces height variations of fin structures across the wafer. A gate traverses the fin structure and S/D regions are disposed in the fin structure adjacent to the gate. The device further includes a channel between the S/D regions below the gate and a first stressor to cause the channel to have a first strain to improve carrier mobility.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 4a-f show other embodiments of a device;

FIGS. 6a-b show combinations of channel, channel stressor and S/D stressor materials for embodiments of devices;

FIGS. 8a-d show cross-sectional views of another embodiment of a process for forming a device;

FIGS. 9a-b show cross-sectional views of yet another embodiment of a process for forming a device;

DETAILED DESCRIPTION

The embodiments generally relate to devices, such as semiconductor devices or ICs. More particularly, some embodiments relate to transistors employed to form ICs. The ICs can be any type of IC. For example, the IC may be a dynamic or static random access memory, a signal processor, or a system on chip (SoC) device. The ICs can be incorporated into, for example, consumer electronic products, such as computers, cell phones, and personal digital assistants (PDAs). Other types of devices or products are also useful.

Figure 1A:
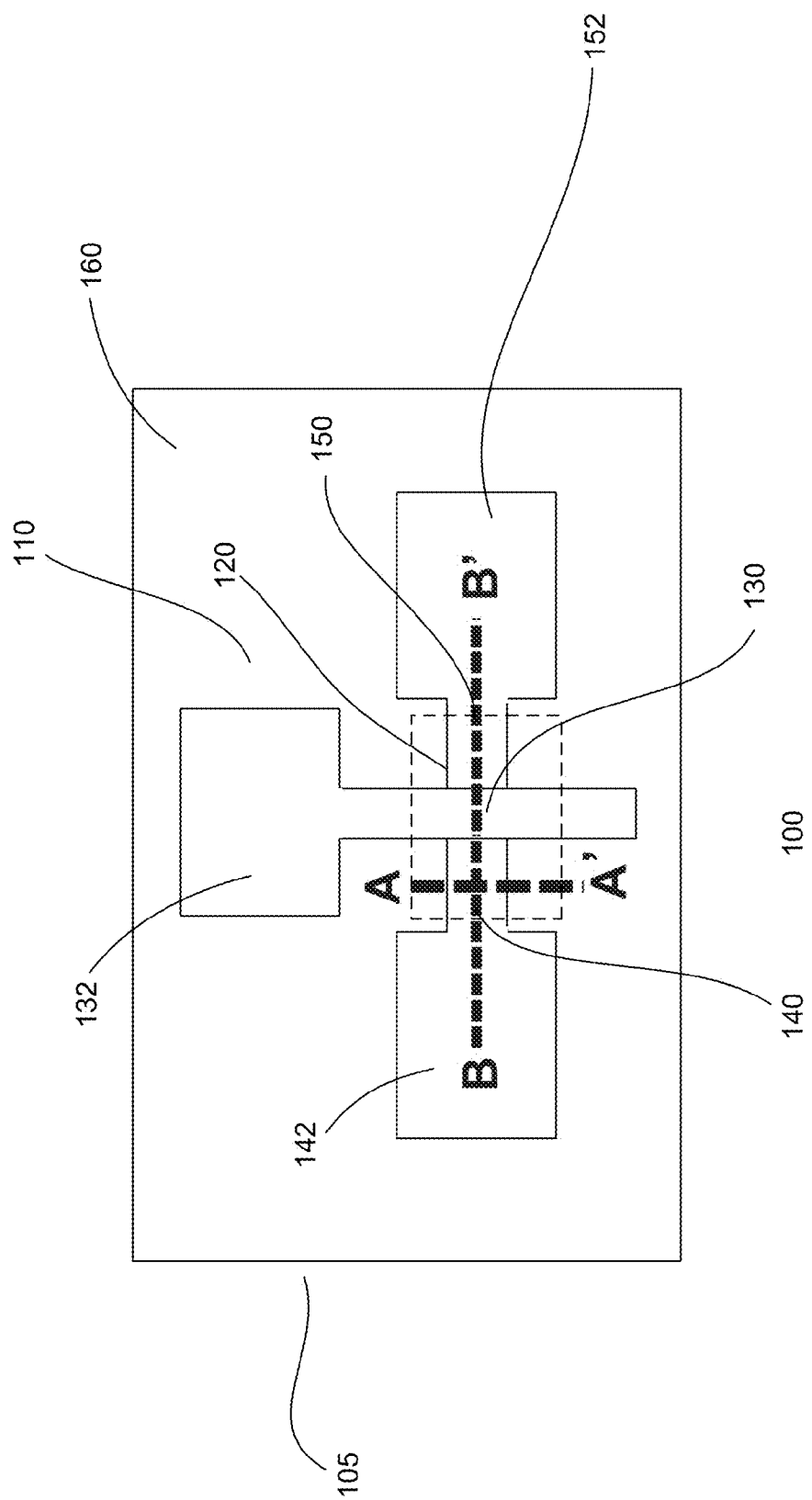
FIGS. 1a-c show various views of an embodiment of a device.
Figure 1B:
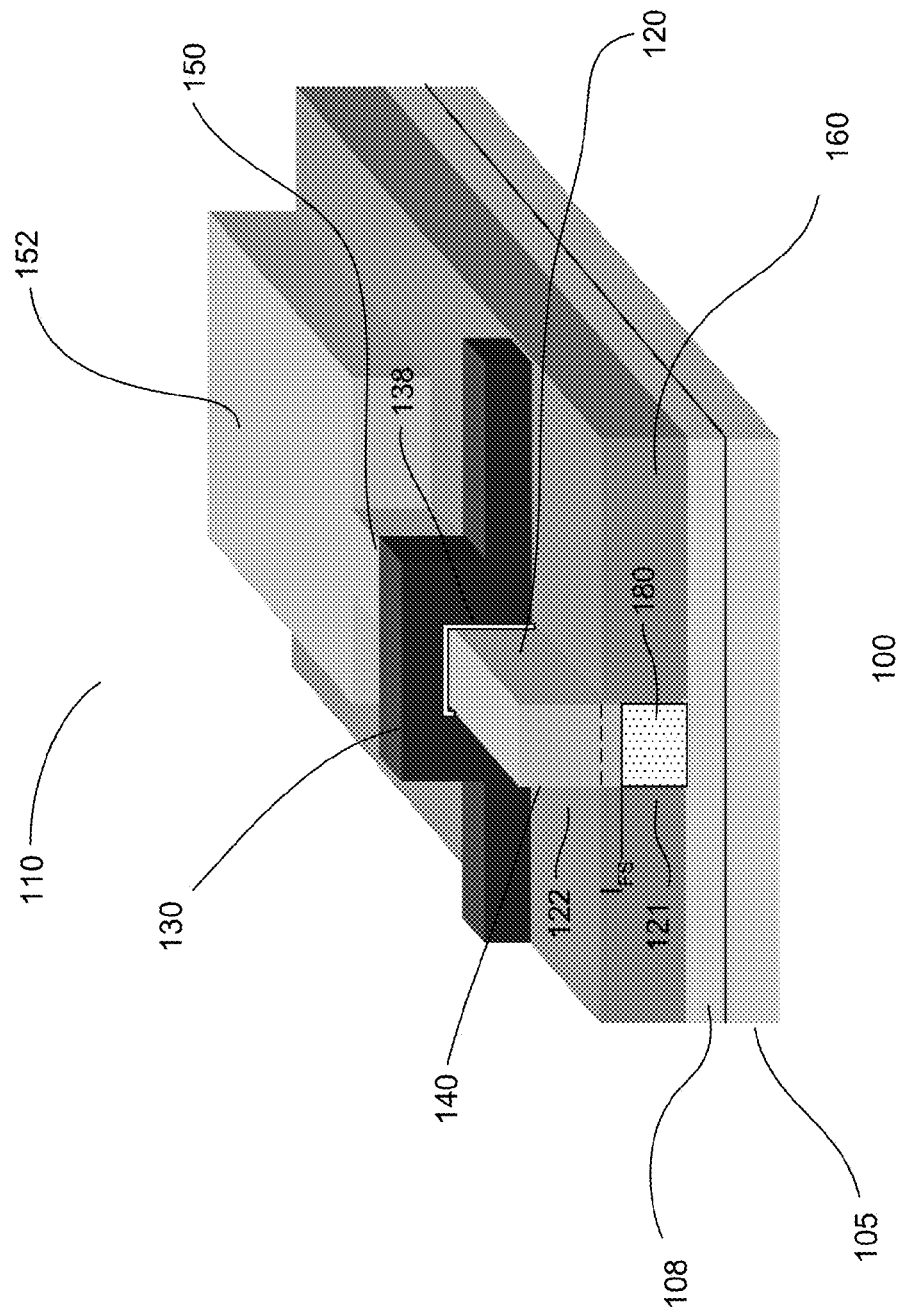
Figure 1C:
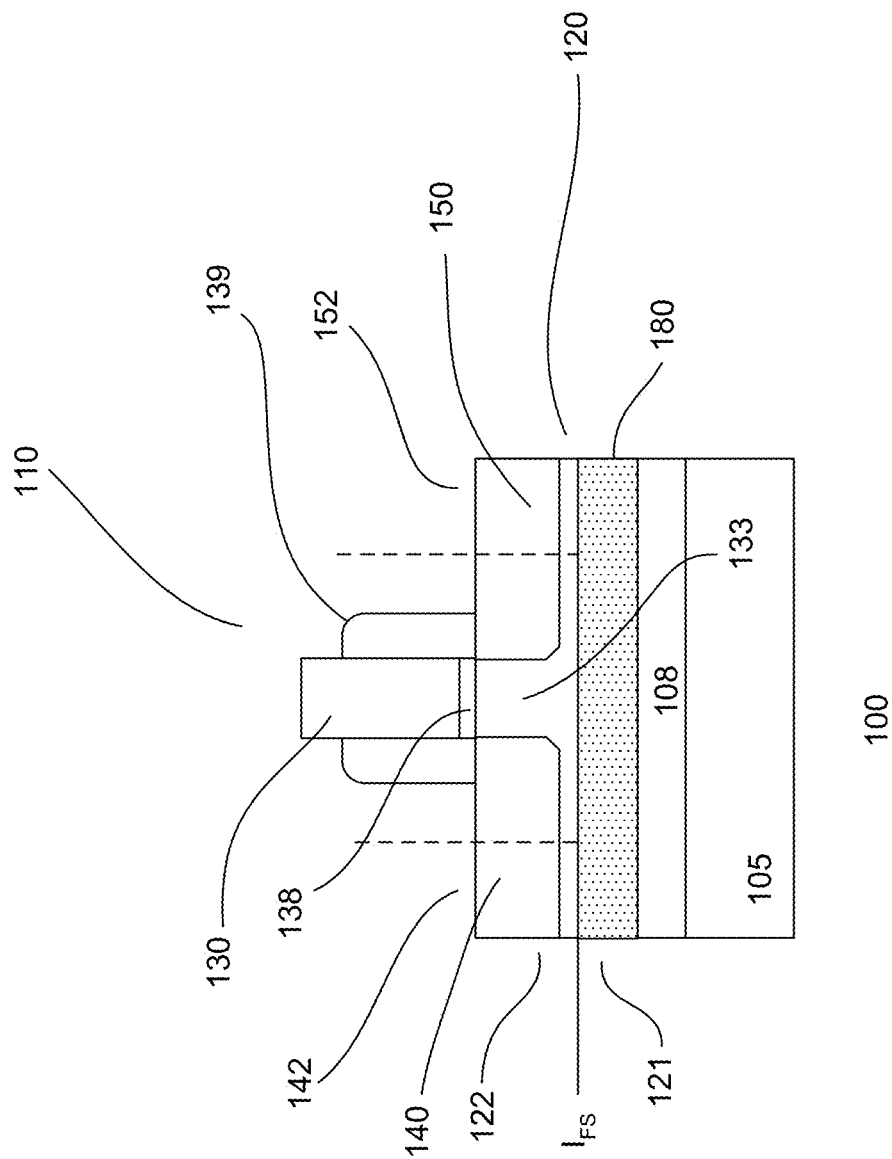

FIGS. 1a-c show various views of a device 100. FIG. 1a shows a top view while FIG. 1b shows a 3-dimensional view of the device along A-A' and FIG. 1c shows a cross-sectional view of the device along B-B'. The device, for example, comprises an IC. Other types of devices may also be useful. Referring to FIGS. 1a-c, a substrate 105 serves as a base for the device. The substrate, for example, comprises a silicon substrate. The substrate may be a lightly doped substrate. For example, the substrate may be a lightly doped p-type ($p^-$) substrate. In some embodiments, the substrate may be a lightly doped n-type ($n^+$) substrate. Other types of substrates may also be useful. For example, the substrate may be a heavily p-doped ($p^+$), n-doped or intrinsic substrate or a substrate having other types of semiconductor materials, such as silicon-germanium (SiGe), germanium (Ge), gallium-arsenic (GaAs) or any other suitable semiconductor materials, including subsequently developed materials.

The substrate is prepared with a device region for a transistor 110. The transistor, in one embodiment, comprises a finFET. The device may include other device regions (not shown). For example, the substrate may include other device regions for which other types of transistors or components of the IC may be formed. For example, the substrate may include p-type and n-type components, such as high, medium and low voltage p-type and n-type components. Various types of n-type and p-type wells are provided for these components. P-type dopants can include boron (B), aluminum (Al), indium (In) or a combination thereof, while n-type dopants can include phosphorus (P), arsenic (As), antimony (Sb) or a combination thereof.

The device region, for example, may be isolated from other device regions by, for example, a dielectric layer 160. The dielectric layer is disposed on the surface of the substrate. The dielectric layer comprises, in one embodiment, silicon oxide. In other embodiments, the dielectric layer may comprise silicon nitride. Other types of dielectric layers, including multiple dielectric layers, may also be useful. For example, the dielectric layer may comprise a second dielectric layer over a first dielectric layer. The second dielectric layer may serve as an etch stop to protect the first dielectric layer. For example, a silicon nitride layer may be provided over a silicon oxide layer or a silicon oxide layer may be provided over a silicon nitride layer. The dielectric layer serves to electrically isolate a gate 130 of the transistor from the substrate. The thickness of the dielectric layer, for example, may be about 30-500 nm. In other embodiments, the thickness of the dielectric layer may be about 30-100 nm. Other thicknesses may also be useful.

In one embodiment, the dielectric layer comprises a non-selectively etched top surface. The non-selectively etched top surface, for example, has been etched with a low etch rate chemistry with respect to the dielectric layer. The low etch chemistry has a high etch rate for removal of a layer above selective to the dielectric layer. For example, the low etch rate chemistry etches the dielectric layer at a low ratio such as about 1:5 or 1:10 compared to the layer above. Other low etch ratios may also be useful.

In some embodiments, isolation regions, such as shallow trench isolation regions, may be provided for substrates having hybrid planar and/or 3-dimensional devices for isolating such devices. In other embodiments, the dielectric layer may also be used to isolate hybrid devices. Other types of isolation regions may also be useful.

A doped isolation well 108 is disposed on an upper portion of the substrate in the device region. The isolation well, in one embodiment, comprises dopants of a second polarity type. For example, the isolation well may contain p-type dopants for a n-channel device. Alternatively, a n-type isolation well may be provided for a p-channel device. The isolation well may be lightly or intermediately doped with the second polarity type dopants. For example, the dopant concentration of the isolation well may be about $10^{16}$-$10^{19}$ atoms/cm$^3$. Other dopant concentrations may also be useful for the isolation well. The isolation well may serve to isolate a first type device from a second type device. For example, a p-type isolation well is used to isolate a n-type device from a p-type device or a n-type isolation well is used to isolate a p-type device from a n-type device.

The transistor, in one embodiment, comprises a fin structure 120 disposed on the surface of the substrate. The fin structure may be an intrinsic or undoped fin structure. In some embodiments, the fin structure may be a lightly doped fin structure. The fin structure, for example, may be lightly doped with second polarity type dopants. The second polarity doped fin structure is used for, for example, a first polarity type device. For example, the fin structure may comprise p-type dopants for an n-channel device or n-type dopants for a p-channel device. The fin structure, for example, may be an elongated member with a rectangular cross-section. Other types of fin structures may also be useful. As shown, the fin structure is disposed along a first direction (e.g., x direction).

The fin structure includes bottom and top device portions. The top device portion is the portion of the fin structure above the surface of the dielectric layer and the bottom device portion is the portion below the surface of the dielectric layer to the top of the substrate, as indicated by the dotted line. For example, the bottom device portion has a height equal to the thickness of the dielectric layer. The top portion, in one embodiment, may determine a height of the device. The top portion may be equal to the height of the device. In other embodiments, the top portion contributes to determining the device height. For example, the device height may be determined by a sub-portion of the top portion of the fin structure. The height of the top portion may factor in determining a channel width of the device. In some embodiments, the top portion or a sub-portion of the top portion may determine the channel width. In other embodiment, the top portion or a sub-portion of the top portion and the width of the fin structure may determine the channel width of the device.

The height of the top device portion of the fin structure may be about 100-1000 Å. In some embodiments, the height of the top portion of the fin structure is about 200-800 Å. In other embodiments, the height of the top portion of the fin structure is about 200-500 Å. The width of the fin structure may be about 100-1000 Å. In some cases, the width of the fin structure may be included in determining the channel width of the device. Other dimensions for the fin structure may also be useful. The dimensions of the fin structure, for example, may depend on device or design requirements.

In one embodiment, the dielectric layer with the non-selectively etched top surface enables the top device portion of the fin structures to be more consistent from fin structure to fin structure across the wafer. Since the top portion of the fin structure determines the height of the device, reducing height variation of the top portion of the fin structures results in more consistent device characteristics across the wafer.

A gate 130 is disposed on the dielectric layer. The gate, for example, comprises an elongated member with a rectangular cross-section. Other types of gates may also be useful. In one embodiment, the gate is disposed on the dielectric layer along a second direction (e.g., y direction) and traverses the fin. The second direction, for example, is perpendicular to the first direction. Providing first and second directions which are not perpendicular to each other may also be useful. The dielectric layer, for example, provides isolation to prevent the region under the gate on the dielectric layer from turning on. The gate, as shown, wraps around the fin.

The gate, in one embodiment, comprises a semiconductor material. For example, the gate comprises polysilicon. Other types of materials may also be used to form the gate. For example, the gate comprises a metal gate, such as TaN or TiN. Separating the gate and the fin is a gate dielectric layer 138. The gate dielectric layer, for example, comprises silicon oxide. Other types of gate dielectric material may also be useful. For example, the gate dielectric layer may be HfSiON, SiON or HfO$_2$. In some embodiments, the gate dielectric may further include a work function tuning layer. For example, La$_2$O$_3$ may be provided for an n-type device while TiN/Al/TiN may be provided for a p-type device in addition to HfSiON and/or HfO$_2$.

Dielectric spacers 139 may be provided on sidewalls of the gate. The dielectric spacers, for example, may comprise silicon nitride. Other types of dielectric materials may also be used. For example, the spacers may comprise silicon nitride or multiple layers of dielectric materials, such as silicon oxide and silicon nitride. In other embodiments, no dielectric spacers are provided on the gate sidewalls.

First and second fin contact regions 142 and 152 may be provided. The first and second fin contact regions are coupled to ends of the fin. For example, the first fin contact region is coupled to a first end of the fin and the second fin contact region is coupled to a second end of the fin. The fin contact regions, as shown, may be wider than the width of the fin structure. The fin contact regions may be rectangular in shape. Other shapes may also be useful. The contact regions may be integral parts of the fin structure.

First and second source/drain (S/D) regions 140 and 150 are disposed in the fin structure adjacent to the gate. For example, the first and second S/D regions are disposed in the fin structure adjacent to the gate, including the fin contact regions. The S/D regions comprise dopants of a first polarity type for a first type device. For example, the S/D regions may contain n-type dopants for a n-type or n-channel device or p-type dopants for a p-type or p-channel device. The S/D regions, in one embodiment, are heavily doped regions. For example, the dopant concentration of the S/D regions may be about $10^{18}$-$10^{20}$ atoms/cm$^3$. A channel 133 is located in the upper portion of the fin between the S/D regions and below the gate.

In some embodiments, the S/D regions may be provided with S/D extension regions. The S/D extension regions may be lightly doped portions of the S/D regions. The lightly doped S/D extension regions have lower dopant concentrations than the heavily doped S/D regions. The S/D extension regions, for example, extend beneath the spacers to connect the channel to the S/D regions. The S/D extension profile may extend beneath the gate. Providing a S/D extension profile which underlaps the gate may increase resistance and have better short channel effect.

In one embodiment, the S/D extension regions may occupy the fin structure adjacent to the gate and the heavily doped S/D regions may occupy the fin contact regions 142 and 152 (as indicated by the dotted line in FIG. 1c). In other embodiments, the S/D extension regions may occupy portions of the fin structure adjacent to the gate and the heavily doped S/D regions may occupy the remaining portions of the fin structure and the fin contact regions. For example, the heavily doped S/D regions may occupy the fin contact regions and portion adjacent to the ends of the fin structure while the S/D extension regions occupy portions adjacent to the gate.

The depth of the S/D extension regions may be shallower than the heavily doped S/D regions. Alternatively, as shown, the S/D extension regions may have the same depth as the heavily doped S/D regions. In other cases, the S/D extension regions may be deeper than the heavily doped S/D regions. Other configurations of S/D extension and heavily doped S/D regions may also be useful. The fin contact regions may serve as S/D contact pads/regions.

A gate contact pad 132 may be provided on the dielectric layer. The gate contact pad is coupled to, for example, an end of the gate. As shown, the gate is provided with one contact pad 132 disposed on a first end of the gate. The gate contact pad may be rectangular in shape. Other shapes may also be useful. The gate contact pad, in one embodiment, may be an integral part of the gate. Other types or configurations of gate contact pad may also be useful.

In other embodiments, two gate contacts may be provided. Two gate contacts can be used for a transistor with two independent gates. For example, gate contacts may be provided at first and second ends of the gate. For embodiments with two independent gates, the gate may be separated at the top of the fin structure to form two separate gates. For example, the portion of the gate above the surface of the fin structure is removed.

In one embodiment, the fin structure includes first and second portions 121 and 122. The first portion is disposed below the second portion. In one embodiment, the first portion serves as a stressor portion and the second portion serves as a non-stressor portion. The non-stressor portion includes at least a portion of the fin structure to be stressed by the stressor portion. In one embodiment, the second or non-stressor portion includes the portion of the fin structure to be stressed by the stressor portion. An interface $I_{FS}$ of the first and second portions may be disposed below the top surface of the dielectric layer (e.g., in the bottom device portion of the fin). Locating $I_{FS}$ at other parts of the fin structure may also be useful. For example, $I_{FS}$ may be disposed at or above the top surface of the dielectric layer.

The S/D regions are disposed in the second portion of the fin structure. The bottom of the S/D regions may be at about the interface $I_{FS}$ of the first and second portions. In other embodiments, the bottom of the S/D regions may be above or below $I_{FS}$. The depth of the S/D regions may depend on, for example, design requirements. In one embodiment, the second portion comprises a crystalline material. The crystalline material may be an epitaxial crystalline material. In other embodiments, the crystalline material may be a recrystallized crystalline material. In some embodiments, the second portion may comprise a combination of crystalline and recrystallized crystalline materials. The crystalline material, in one embodiment, comprises silicon. Other types of crystalline materials may also be useful. For example, the crystalline material of the second portion may be SiGe, Ge or GaAs. In some embodiments, the second portion may comprise a polycrystalline or an amorphous material.

The stressor portion comprises a stressor material to cause a first strain in at least a portion of the non-stressor portion of the fin structure. In one embodiment, the stressor causes a first strain in the channel of the device that is disposed in the non-stressor portion of the fin structure. The stressor portion forms a buried stressor 180 for the device. For example, the stressor causes a first strain in the channel from below. The strained channel enhances carrier mobility to improve device performance. The first strain may depend on the polarity of the device. The first strain may also depend on the device orientation as well as the type of material used to form the channel of the device, such as at least a sub-portion of the second portion of the fin structure. For example, the first strain may be a tensile strain for an n-type silicon device or compressive strain for a p-type silicon device. The strain may either be biaxial, uniaxial or a combination thereof. Other configurations of strain may also be useful.

In one embodiment, the buried stressor comprises a crystalline material. To cause a strain on the channel, the stressor should have a crystal lattice which is larger or smaller than the crystal lattice of the second portion of the fin structure. In one embodiment, the stressor produces a biaxial first strained top surface of the fin structure and uniaxial first strained side surfaces of the fin structure. Other configurations of strains on the fin structure may also be useful. The first strain may be tensile for a buried stressor which has a larger crystal lattice than the crystal lattice of the second portion of the fin structure. On the other hand, the first strain may be a compressive strain if the crystal lattice of the buried stressor is smaller than the crystal lattice of the second portion of the fin structure. The crystalline material of the stressor may be, for example, Si, Ge, SiGe, SiGe:C, SiGeSn, GeSn, SiC, GaAs or a combination thereof. Other types of materials may also be useful. The material selected may depend on, for example, the desired strain in the channel and material of the channel (e.g., second portion).

Although a single fin structure is shown, some embodiments may include a plurality of fin structures configured in a closely packed manner. The fin structures may be controlled by a common gate. Such an arrangement forms, for example, multiple transistors arranged in a finger configuration to increase drive current. In other embodiment, the fin structures may be independently controlled by respective gates or a combination of common and independent gates.

Figure 2A:
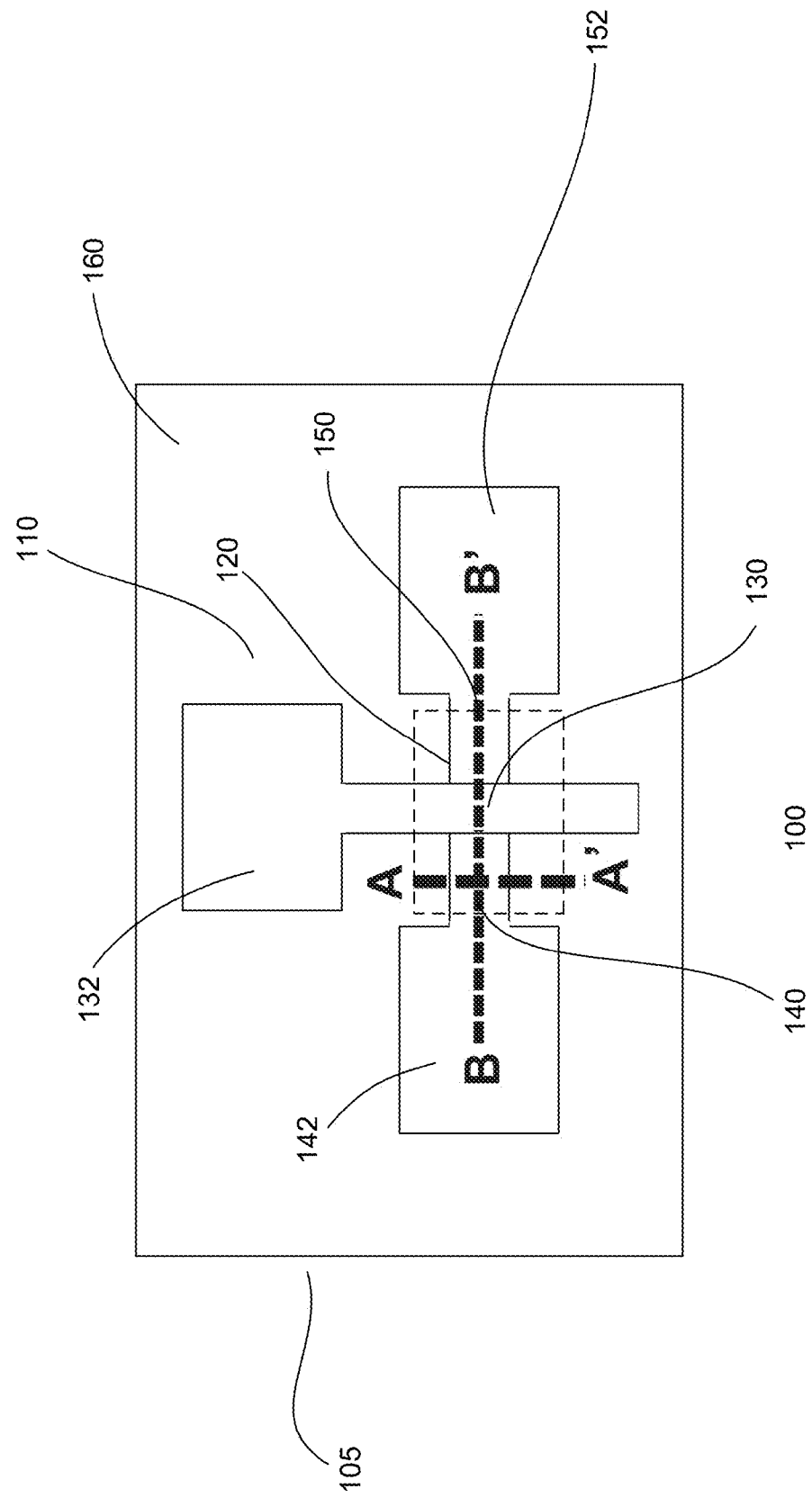
FIGS. 2a-c show various views of another embodiment of a device.
Figure 2B:
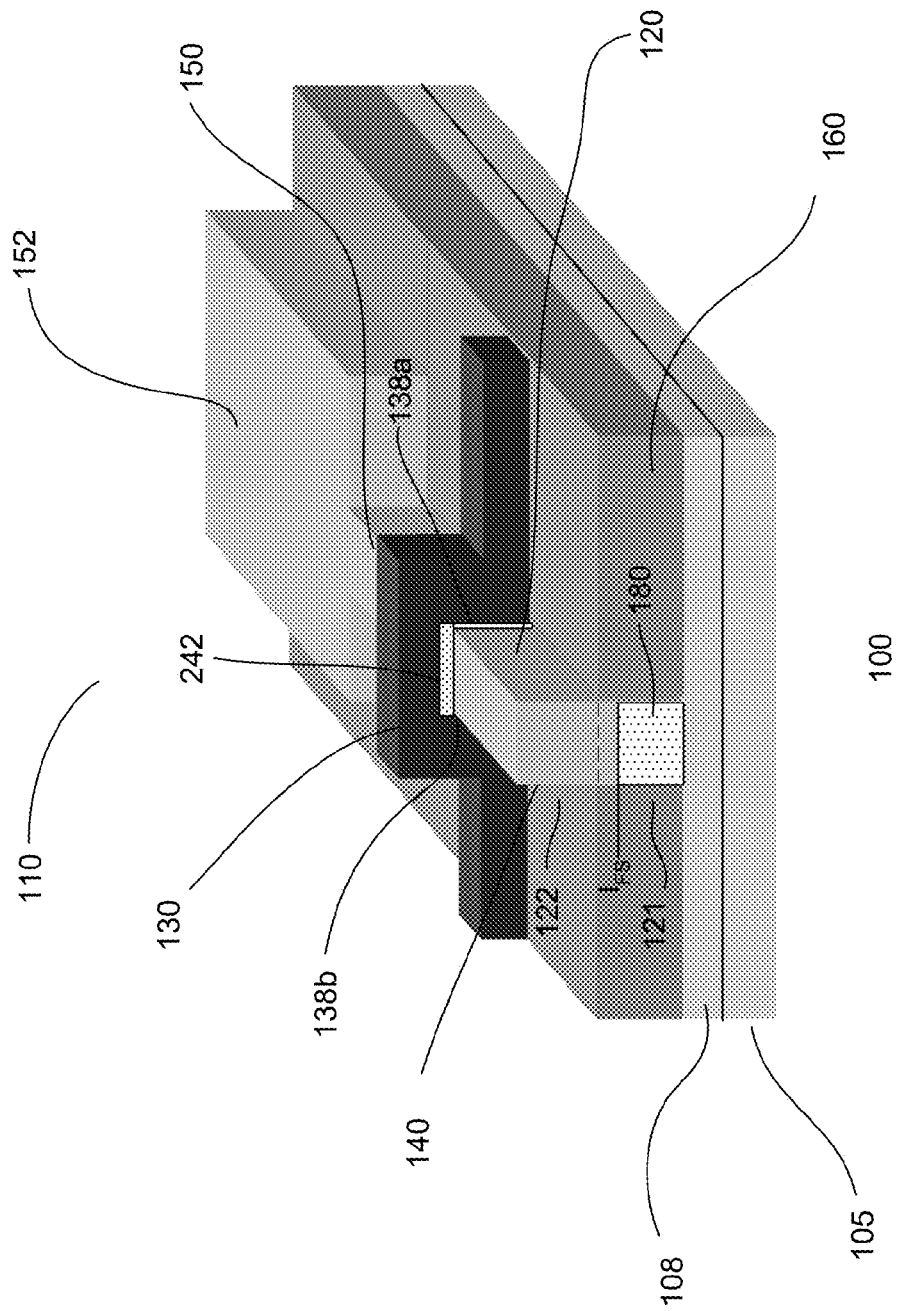
Figure 2C:
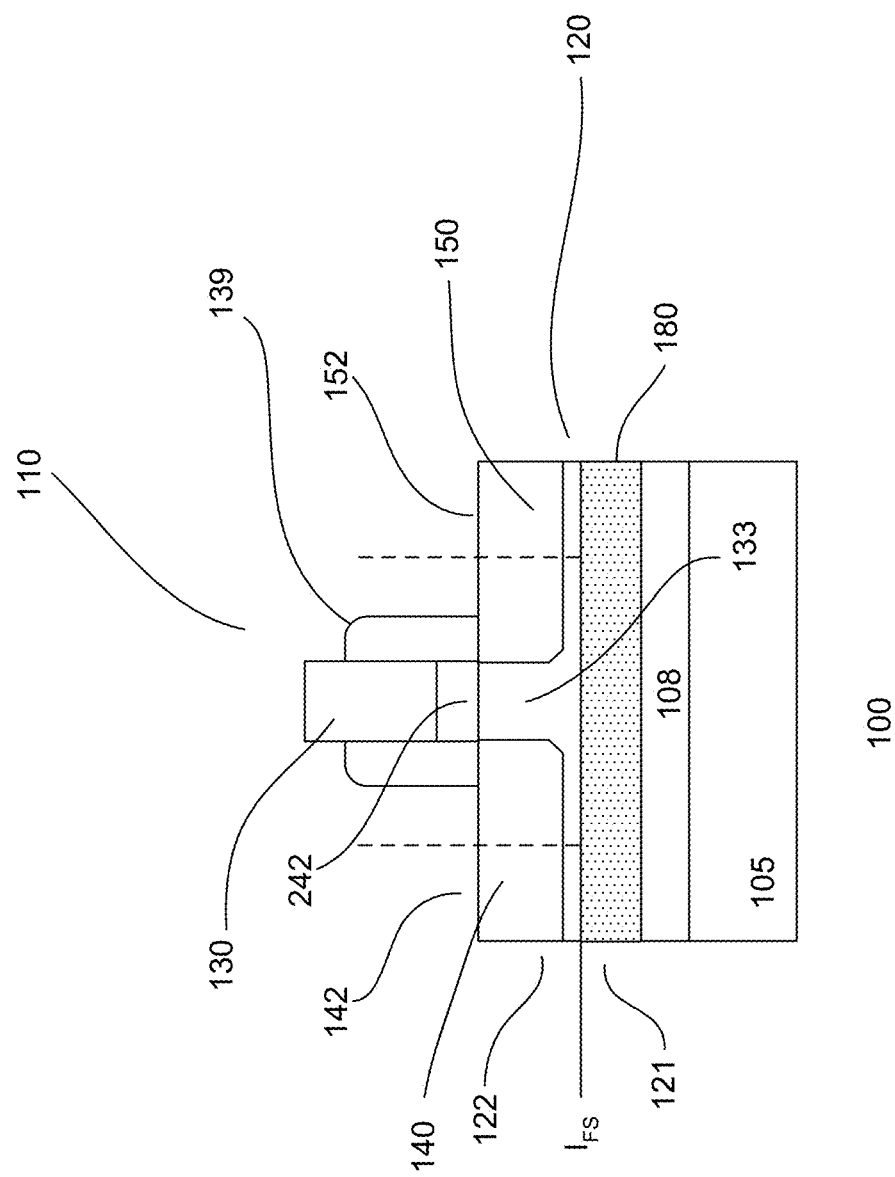

FIGS. 2a-c show various views of another embodiment of a device 100. FIG. 2a shows a top view while FIG. 2b shows a 3-dimensional view of the device along A-A' and FIG. 2c shows a cross-sectional view of the device along B-B'. The device, for example, comprises an IC. Other types of devices may also be useful. The device shown in FIGS. 2a-c is similar to that shown in FIGS. 1a-c. As such, the common features need not be discussed.

A hard mask layer 242 is provided on the top surface of the fin structure 120. The hard mask layer, for example, comprises silicon nitride. Other types of dielectric hard mask material may also be useful. The hard mask serves to separate the gate dielectric layer into two gate dielectric layers 138a-b on the sides of the fin structure. The use of the hard mask results in the transistor having a double gate. The two gates of the double gate may be commonly controlled with a single gate signal. Providing a double gate gives greater flexibility to designer for defining the width and height of the fin structures.

In other embodiments, the double gate may be independently controlled by two independent gate signals. In the case of two independent gates, the gate may be separated, for example, at the top of the gate. The hard mask may serve as an etch stop for patterning the gate. For example, the portion of the gate above the fin structure may be removed by polishing, such as chemical mechanical polishing (CMP), using the hard mask as a polish stop. Other techniques for forming double independent gates may also be useful.

Figure 3A:
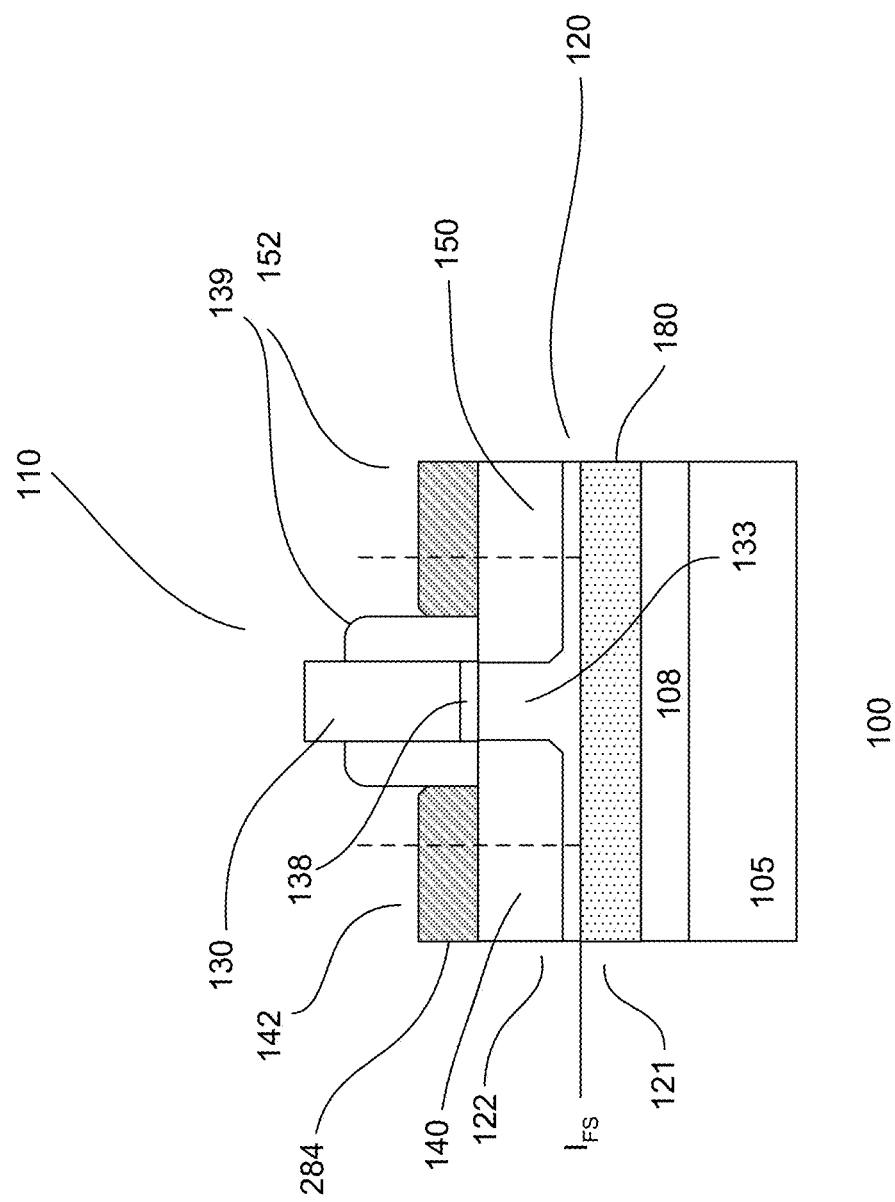
FIGS. 3a-b show various views of another embodiment of a device.
Figure 3B:
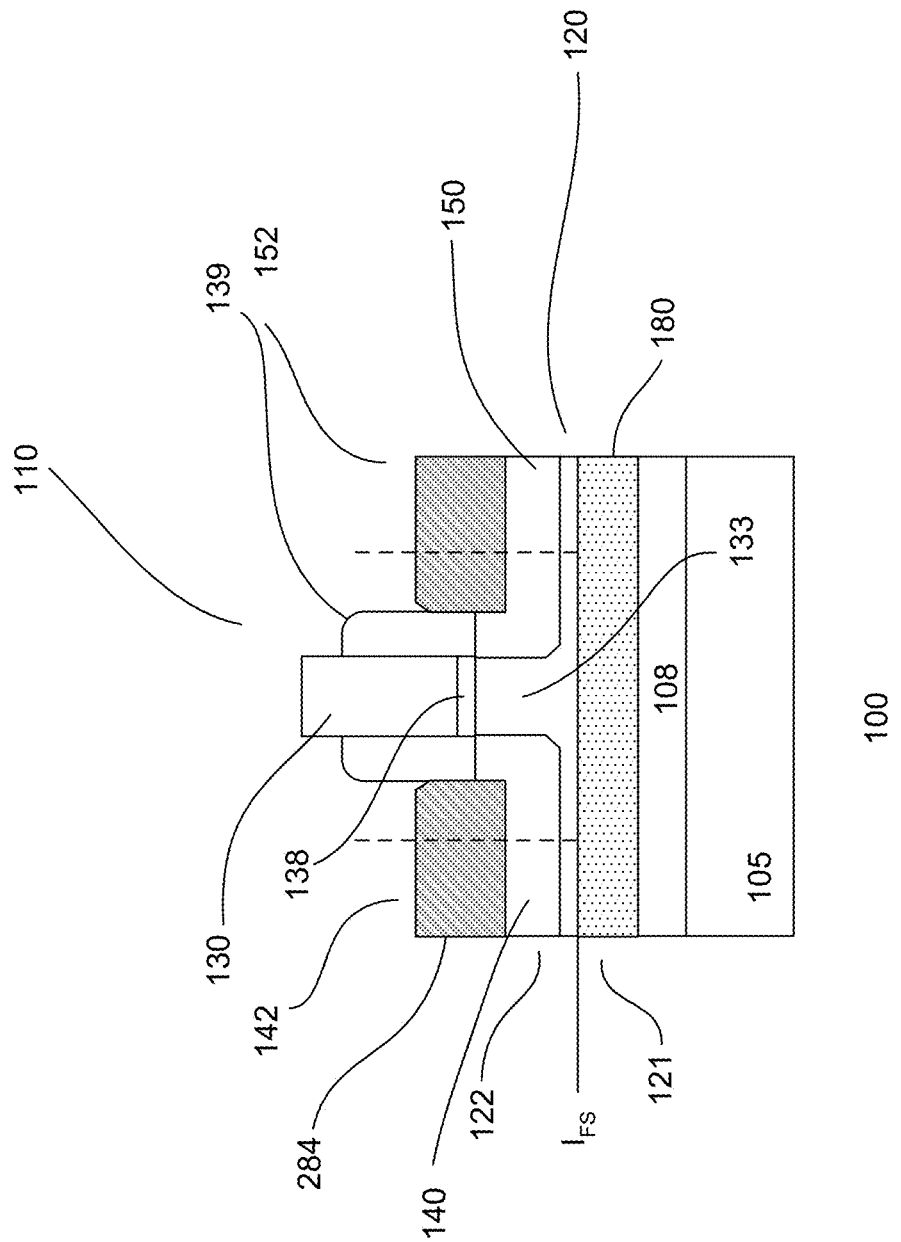

FIGS. 3a-b show cross-sectional views of other embodiments of a device 100. The device, for example, is similar to that described in FIGS. 1a-c. As such, the common features need not be discussed.

As shown in FIGS. 3a-b, the device includes a buried stressor 180 in the first portion 121 of the fin structure. In addition, S/D stressors 284 are provided on the S/D regions 140 and 150, as shown in FIG. 3a. The S/D stressors may extend to the S/D contact regions. The S/D stressors are disposed on the surface of the second portion of the fin structure in the S/D regions, forming raised S/D stressors. Alternatively, as shown in FIG. 3b, the S/D stressors 284 are embedded S/D stressors. The embedded S/D stressors are recessed below the surface of the second portion of the fin structure. The embedded S/D stressors may extend above the surface of the second portion, forming embedded raised S/D stressors. Providing embedded stressors which do not extend above the surface of the second portion may also be useful. The S/D stressors comprise first polarity type dopants and are, for example, part of the heavily doped S/D regions. The S/D stressors may be doped by ion implantation, in situ doping, or a combination thereof.

The S/D stressors comprise a stressor material to cause a first strain in the channel of the device. The S/D stressors cause a first strain in the channel from above. The strained channel enhances carrier mobility to improve device performance. The first strain may depend on the polarity of the device. The first strain may also depend on the device orientation as well as the type of material used to form the channel of the device, such as at least a sub-portion of the second portion of the fin structure. For example, the first strain may be a tensile strain for a n-type silicon device or compressive strain for a p-type silicon device. The strain may either be biaxial, uniaxial or a combination thereof. Other configurations of strain may also be useful.

In one embodiment, the S/D stressor comprises a crystalline material. To cause a strain on the channel, the stressor should have a crystal lattice which is larger or smaller than the crystal lattice of the second portion of the fin structure. In one embodiment, the S/D stressors produce a uniaxial first strain on a surface of the fin structure. For example, the S/D stressors produce a uniaxial first strain on the top and side surfaces of the fin structure. The first strain may be compressive for the S/D stressors which have a larger crystal lattice than the crystal lattice of the second portion of the fin structure. On the other hand, the first strain may be a tensile strain if the crystal lattice of the stressors is smaller than the crystal lattice of the second portion of the fin structure. The crystalline material of the S/D stressors may be, for example, Si, Ge, SiGe, SiGe:C, SiGeSn, GeSn, SiC, GaAs, or a combination thereof. Other types of materials may also be useful. The material selected may depend on, for example, the desired strain in the channel and material of the channel (e.g., second portion).

In some embodiments, the device of FIGS. 2a-c may also be provided with S/D or embedded S/D stressors of FIGS. 3a-b. In yet other embodiments, the device of FIGS. 1a-c, 2a-c and 3a-b may be provided with only S/D or embedded S/D stressors without the buried stressor.

Figure 4A:
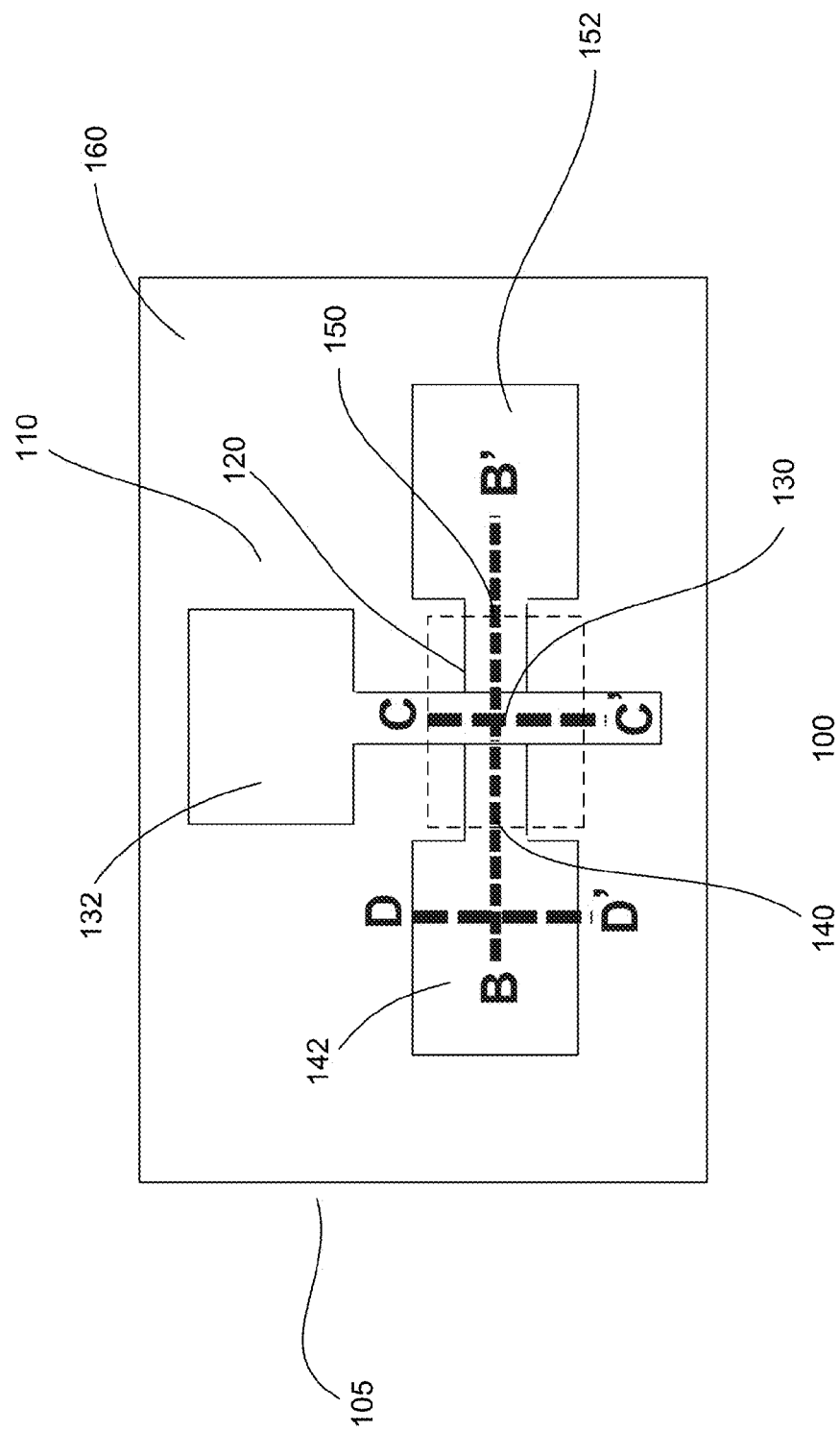
Figure 4B:
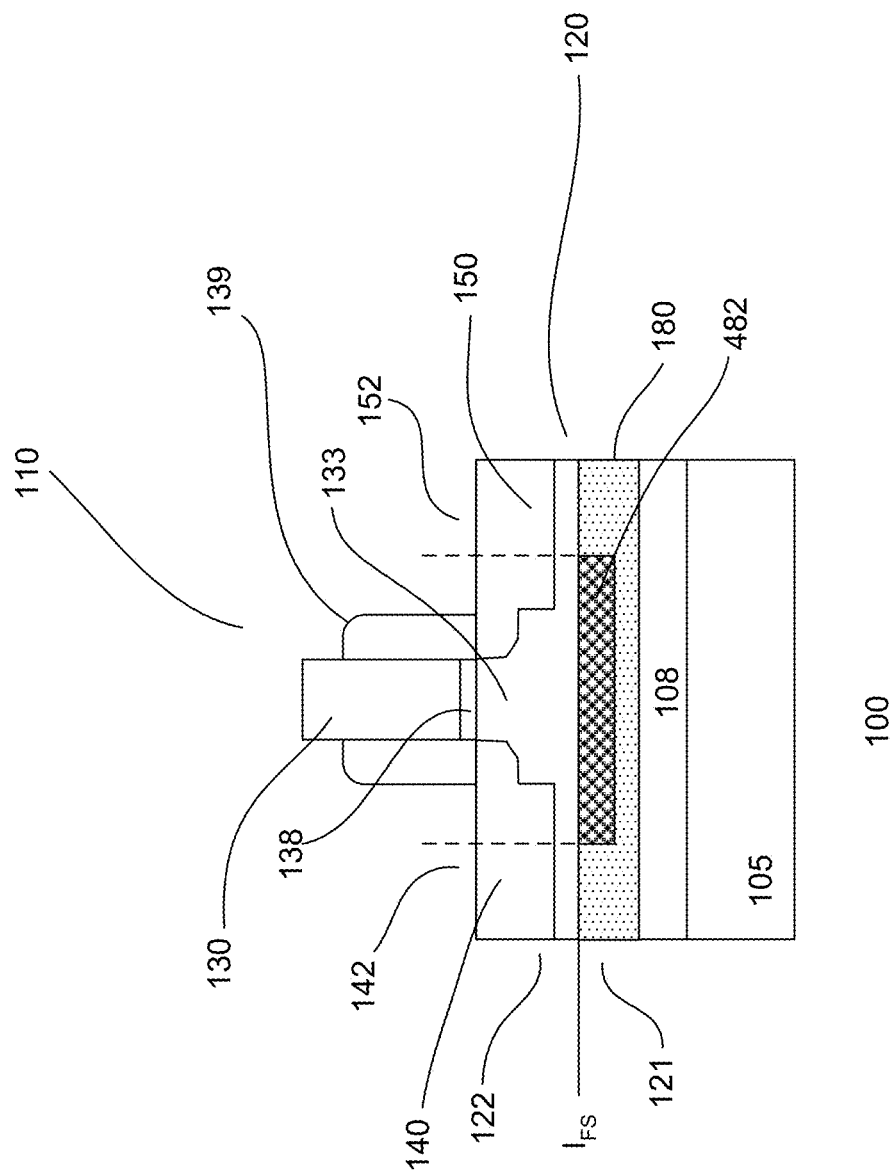
Figure 4D:
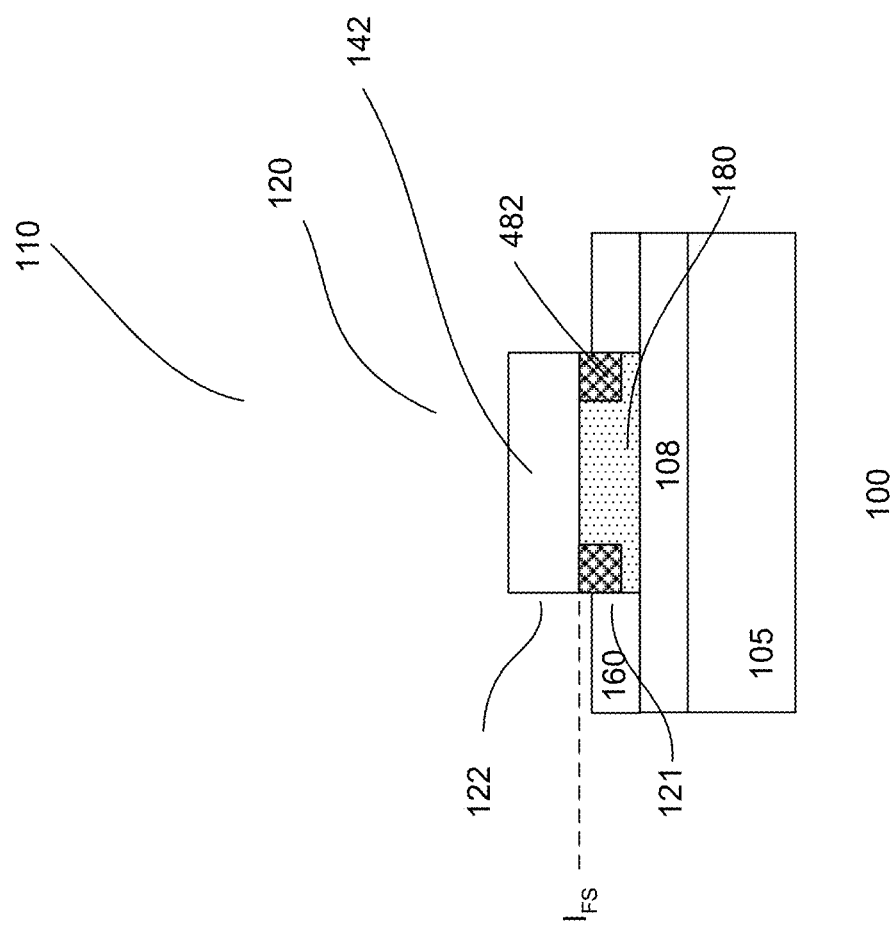
Figure 4E:
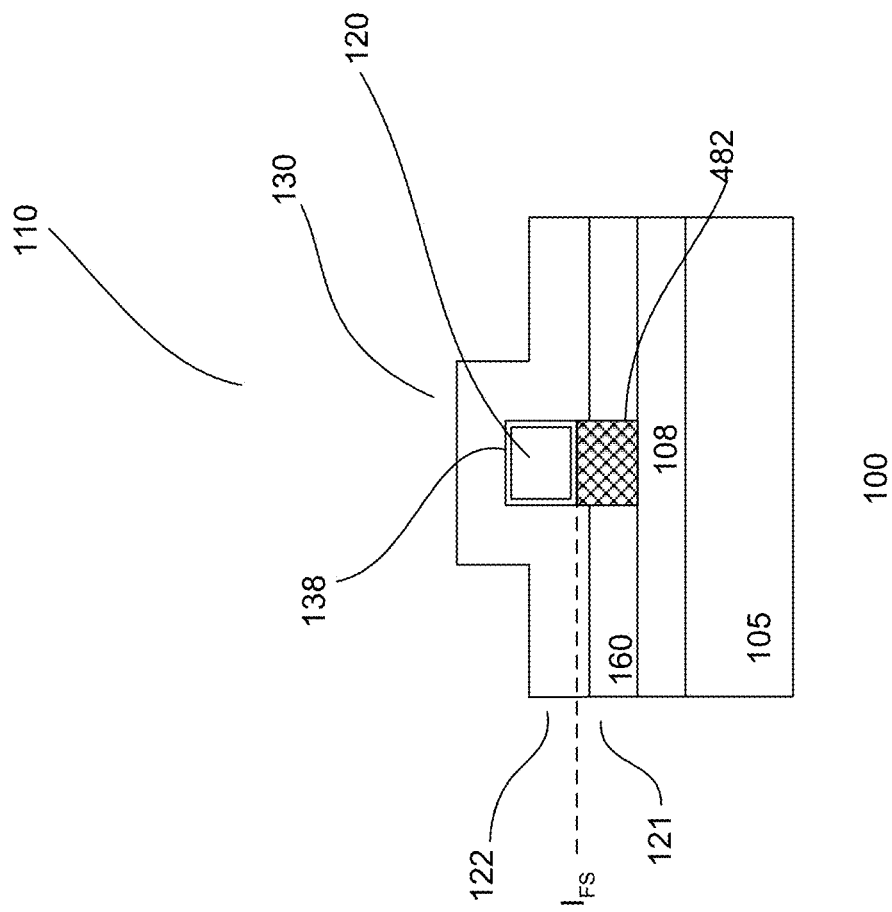
Figure 4F:
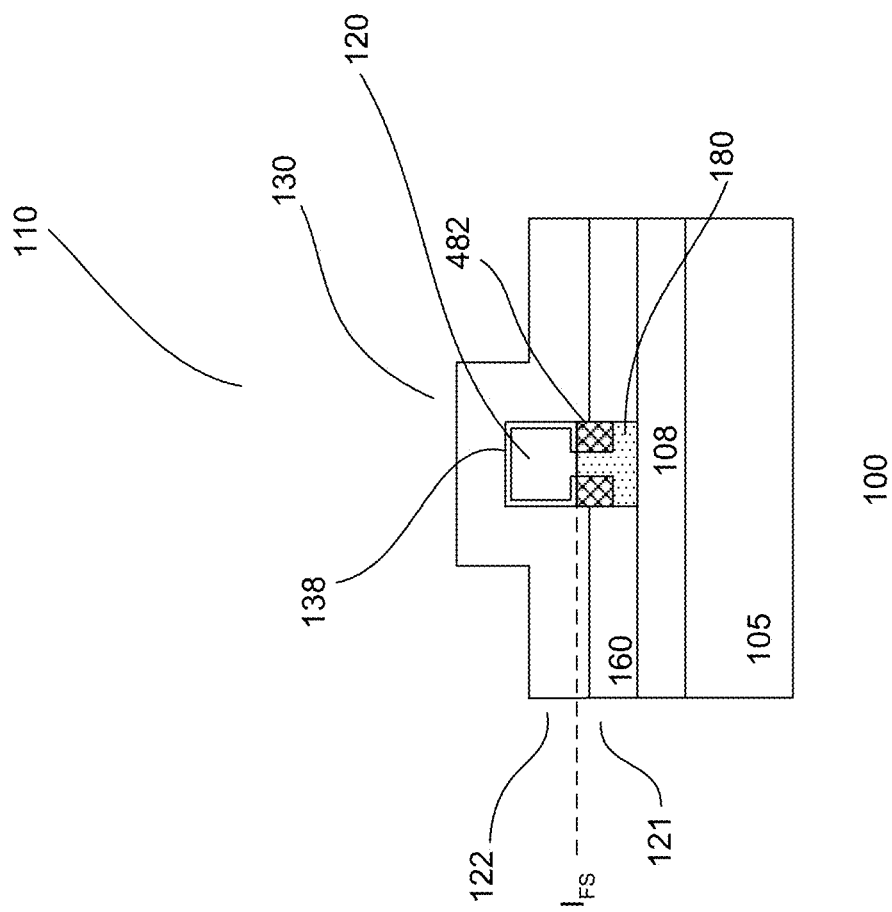

FIGS. 4a-d show various views of another embodiment of a device 100. FIG. 4a shows a top view, FIG. 4b shows a cross-sectional view of the device along B-B', FIG. 4c shows a cross-sectional view of the device along C-C' and FIG. 4d shows a cross-sectional view of the device along D-D'. FIGS. 4e-f show cross-sectional views of other embodiments of a device 100 along C-C'. The device, for example, comprises an IC. Other types of devices may also be useful. The devices shown in FIGS. 4a-f are similar to that shown in FIGS. 1a-c. As such, the common features need not be discussed.

Referring to FIGS. 4a-f, the fin structure 120 is divided into first and second portions 121 and 122. The first portion, for example is below the second portion. An interface of the first and second portions $I_{FS}$ is located above the top surface of the dielectric layer (e.g., above the interface of top and bottom device portions of the fin structure). In other embodiments, the interface $I_{FS}$ may be disposed at other locations of the fin structure. The first and second portions comprise different materials. In one embodiment, the first portion comprises a material which can be removed selectively to the material of the second portion. The S/D regions 140 and 150 are disposed in the second portion of the fin structure. The fin structure includes S/D contact regions 142 and 152 which, for example, are wider than the fin structure. The S/D contact regions form a part of the S/D regions. The S/D regions may be disposed within the second portion of the fin structure. For example, a depth of the S/D regions may be disposed above the interface $I_{FS}$, resulting in a gap between the S/D regions and $I_{FS}$. In other embodiments, the depth of the S/D regions may be disposed at or below $I_{FS}$. The location of the bottom of the S/D regions may depend on the application and design requirements.

In one embodiment, the second portion comprises a crystalline material. The crystalline material may be an epitaxial crystalline material. In other embodiments, the crystalline material may be a recrystallized crystalline material. In some embodiments, the second portion may comprise a combination of crystalline and recrystallized crystalline materials. The crystalline material, in one embodiment, comprises silicon. Other types of crystalline materials may also be useful. For example, the crystalline material of the second portion may be SiGe, Ge or GaAs.

In one embodiment, the first portion comprises a stressor portion with a stressor material to cause a first strain in at least a portion of the second portion of the fin structure. In one embodiment, the stressor causes a first strain in the channel 133 of the device between the S/D regions and below the gate 130. The stressor portion forms a buried stressor 180 for the device. For example, the stressor causes a first strain in the channel from below. The strained channel enhances carrier mobility to improve device performance. The first strain may depend on the polarity of the device. The first strain may also depend on the device orientation as well as the type of material used to form the channel of the device, such as at least a sub-portion of the second portion of the fin structure. For example, the first strain may be a tensile strain for a n-type silicon device or compressive strain for a p-type silicon device. The strain may either be biaxial, uniaxial or a combination thereof. Other configurations of strain may also be useful.

In one embodiment, the buried stressor comprises a crystalline material. To cause a strain on the channel, the stressor should have a crystal lattice which is larger or smaller than the crystal lattice of the second portion of the fin structure. In one embodiment, the stressor produces a biaxial first strained top surface of the fin structure and uniaxial first strained side surfaces of the fin structure. Other configurations of strains on the fin structure may also be useful. The first strain may be tensile for a buried stressor which has a larger crystal lattice than the crystal lattice of the second portion of the fin structure. On the other hand, the first strain may be a compressive strain if the crystal lattice of the buried stressor is smaller than the crystal lattice of the second portion of the fin structure. The crystalline material of the stressor may be, for example, Si, Ge, SiGe, SiGe:C, SiGeSn, GeSn, SiC, GaAs or a combination thereof. Other types of materials may also be useful. The material selected may depend on, for example, the desired strain in the channel and material of the channel (e.g., second portion).

In alternative embodiments, the first portion merely comprises a material which can be selectively removed from the second portion of the fin structure. For example, the first portion need not comprise a stressor material.

In one embodiment, a part of the first material in the first portion of the fin structure is removed to create a void or air gap 482 as shown in FIGS. 4b-c. In one embodiment, an upper part of the first material in the first portion of the fin structure is removed. The upper part in the first portion of the fin structure, in one embodiment, is completely removed. This forms, for example, a void 482 between the second portion and a remaining lower part of the first portion of the fin structure. The void extends across the width of the fin structure.

Since the S/D contact regions are wider, only a part of the first portion of the fin structure is removed, as shown in FIG. 4d. This leaves a part of the first portion of the fin structure remaining in the S/D contact regions. For example, the void 482 does not cut across the complete width of the first portion of the fin structure in the S/D contact regions. The remaining part may serve as a support for the second portion of the fin structure over the void.

In another embodiment, as shown in FIG. 4e, the first material in the first portion of the fin structure is removed to create a void or air gap 482 between the second portion and the substrate. For example, the first portion of the fin structure is removed to provide the void below the channel and a portion of the S/D region. This, for example, creates a void below the channel of the device and a portion of the S/D regions. Providing a void between the substrate and second portion of the fin structure forms a silicon on nothing (SON) device. Providing a SON device advantageously decreases $C_j$ to improve device performance.

Since the S/D contact regions are wider, portion of the fin structure is removed, similar to that shown in FIG. 4d. This leaves a part of the first portion of the fin structure remaining in the S/D contact regions to serve as a support for the second portion of the fin structure over the void.

In other embodiments, an upper part of the first material in the fin structure is partially removed as shown in FIG. 4f. This leaves some material in the upper part remaining which contacts the second portion of the fin structure. As such, a partial void 482 is provided in the upper part of the first material in the fin structure. The partial void does not extend across the width of the fin structure.

Since the S/D contact regions are wider, portion of the fin structure is removed, similar to that shown in FIG. 4d. This leaves a part of the first portion of the fin structure remaining in the S/D contact regions to serve as a support for the second portion of the fin structure over the void.

Exposed surface of the second portion of the fin structure may be oxidized to form the gate dielectric layer 138. Since the void or partial void exposes a bottom of the second portion of the fin structure, the gate dielectric layer may be formed there as well.

Providing a void or partial voids advantageously reduces $C_j$. In addition, providing a void or partial voids under at least the channel allows a stressor to increase its effectiveness on the channel. For example, the channel may be stressed by a stressor more than compared to the absence of the void.

In some embodiments, the void or partial voids, as described in FIGS. 4a-f, may be filled with a dielectric material. The dielectric material, for example, comprises silicon oxide. Other types of dielectric materials may also be useful. The dielectric material filling the void may be selected so that it can be selectively removed with respect to the dielectric layer 160. Providing a dielectric material filling the void or partial voids forms a buried oxide (BOX) device. Providing a BOX device advantageously decreases $C_j$ to improve device performance.

Figure 5A:
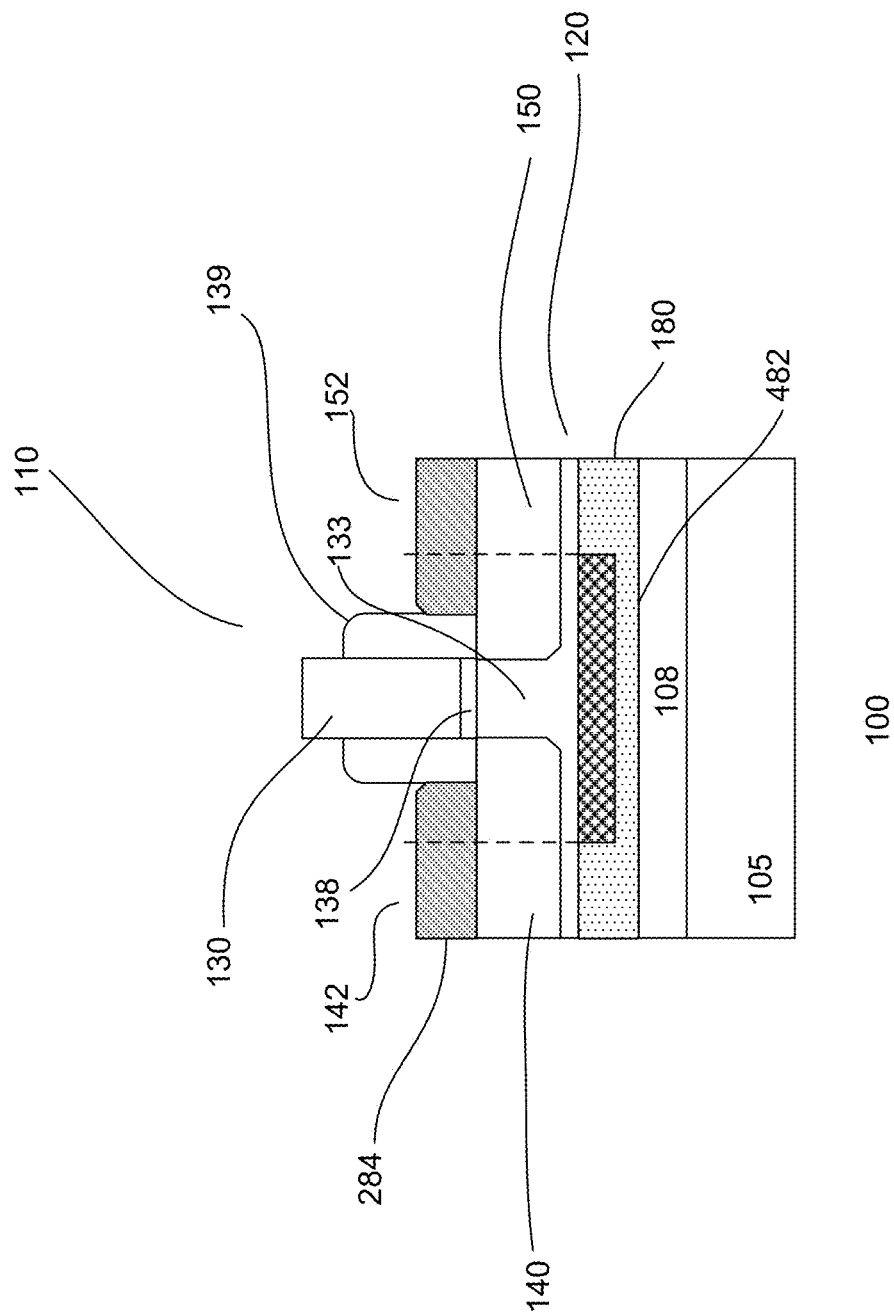
FIGS. 5a-b show various views of an alternative embodiment of a device.
Figure 5B:
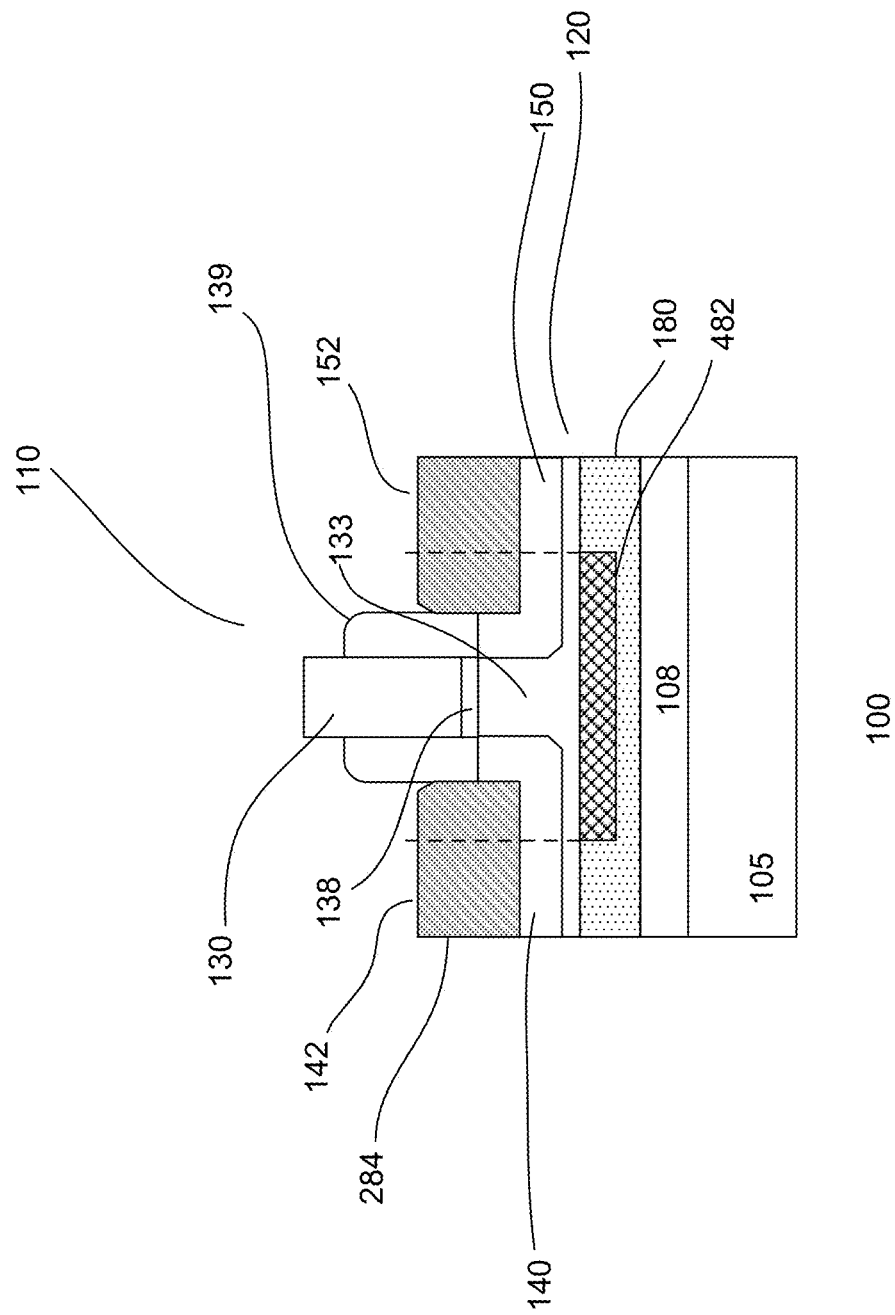

FIGS. 5a-b show cross-sectional views of other embodiments of a device 100. The device, for example, is similar to that described in FIGS. 4a-d. As such, the common features need not be discussed.

As shown in FIG. 5a, S/D stressors 284 are provided on the S/D regions 140 and 150. The S/D stressors may extend to the S/D contact regions. The S/D stressors are disposed on the surface of the second portion of the fin structure in the S/D regions, forming raised S/D stressors. Alternatively, as shown in FIG. 5b, the S/D stressors 284 are embedded S/D stressors. The embedded S/D stressors are recessed below the surface of the second portion of the fin structure. The embedded S/D stressors may extend above the surface of the second portion, forming embedded raised S/D stressors. Providing embedded stressors which do not extend above the surface of the second portion may also be useful. The S/D stressors comprise first polarity type dopants and are, for example, part of the heavily doped S/D regions. The S/D stressors may be doped by ion implantation, in situ doping, or a combination thereof.

The S/D stressors comprise a stressor material to cause a first strain in the channel of the device. The raised S/D stressors cause a first strain in the channel from above. The strained channel enhances carrier mobility to improve device performance. The first strain may depend on the polarity of the device. The first strain may also depend on the device orientation as well as the type of material used to form the channel of the device, such as at least a sub-portion of the second portion of the fin structure. For example, the first strain may be a tensile strain for a n-type silicon device or compressive strain for a p-type silicon device. The strain may either be biaxial, uniaxial or a combination thereof. Other configurations of strain may also be useful.

In one embodiment, the S/D stressors comprise a crystalline material. To cause a strain on the channel, the stressors should have a crystal lattice which is larger or smaller than the crystal lattice of the second portion of the fin structure. In one embodiment, the S/D stressors produce a uniaxial first strain on a surface of the fin structure. In one embodiment, the S/D stressors produce a uniaxial first strain on the top and side surfaces of the fin structure. The first strain may be compressive for S/D stressors which have a larger crystal lattice than the crystal lattice of the second portion of the fin structure. On the other hand, the first strain may be a tensile strain if the crystal lattice of the stressor is smaller than the crystal lattice of the second portion of the fin structure.

In some embodiments, the device of FIGS. 4e-f may be provided with S/D stressors or embedded S/D stressors, as described in FIGS. 5a-b. In other embodiments, the device shown in FIGS. 4a-f may be provided with a hard mask layer, as described in FIGS. 2a-c.

In other embodiments, the various embodiments of FIGS. 1a-c, 2a-c, 3a-b, 4a-f and 5a-b may be provided with a counter doped region and/or a counter doped well, as described in concurrently filed U.S. patent application Ser. No. 12/980,371, titled "Improved FinFET, which is herein incorporated by reference for all purposes. Providing a counter doped region and/or well may reduce junction capacitance $C_j$, which improves performance and reliability.

For example, in one embodiment, a counter doped well is disposed in the substrate below the bottom of the fin structure. The counter doped well comprises first polarity type dopants, which is the same polarity type as the S/D regions. The counter doped well is disposed within the isolation well 108 having second polarity type dopants. In one embodiment, the counter doped well may be a lightly to intermediately doped well. For example, the dopant concentration of the counter doped well may be about $1E10^{18}$ atoms/cm$^3$. Other dopant concentrations may also be useful. The counter doped well for example is disposed below the fin structure, including below the S/D regions and the channel. This, for example, produces a silicon on depletion layer (SODEL) device. Alternatively, the counter doped well may be disposed below the S/D regions but not the channel. This, for example, produces a source/drain on depletion layer (SDODEL) device.

A depletion region is provided to separate the counter doped well and the S/D regions. The height of the depletion region (e.g., distance between the top of the counter doped well and the bottom of the S/D regions) should be selected to enable the depletion regions of the S/D drain regions to merge with the depletion region of the counter doped well at zero bias. For example, at zero bias between the S/D regions and the counter doped well, their depletion regions merge. The height of the depletion region can be tuned based on the doping of the S/D regions and counter doped well to provide a fully depleted region.

By providing a counter doped well, the depletion region of the S/D regions can be extended deeper to increase its width. Increasing the width of the depletion regions reduces the junction capacitance $C_j$ of the device. The larger the separation between the counter doped well and the S/D region while maintaining the merger of the depletion regions, the greater the reduction in $C_j$. Preferably, the thickness of the first portion should be as large as possible while maintaining the merger of the depletion regions to produce the largest depletion width for the greatest reduction in $C_j$.

In other embodiments, a counter doped region is provided in a first portion of the fin structure. The counter doped region comprises first polarity type dopants, which is the same polarity type as the S/D regions. In one embodiment, the counter doped region may be a lightly to intermediately doped region. For example, the dopant concentration of the counter doped region may be about $1E10^{18}$ atoms/cm$^3$. Other dopant concentrations may also be useful. In one embodiment, the dopant concentration is consistent throughout the counter doped region. For example, no tailing off of dopants occur at or near the bottom of the counter doped region. This reduces random-dopant-fluctuation (RDF), which can undesirably cause variations in $V_T$.

A depletion region is provided to separate the counter doped region and the S/D regions. The height of the depletion region (e.g., distance between the top of the counter doped region and the bottom of the S/D regions) should be selected to enable the depletion regions of the S/D drain regions to merge with the depletion region of the counter doped region at zero bias. For example, at zero bias between the S/D regions and the counter doped region, their depletion regions merge. The height of the depletion region can be tuned based on the doping of the S/D regions and counter doped region to provide a fully depleted region.

By providing a counter doped well and/or region, the depletion regions of the S/D regions can be extended deeper to increase their widths. Increasing the widths of the depletion regions reduces the junction capacitance $C_j$ of the device. The larger the separation between the counter doped well or region and the S/D regions while maintaining the merger of the depletion regions, the greater the reduction in $C_j$. Preferably, the thickness of the depletion region should be as large as possible while maintaining the merger of the depletion regions to produce the largest depletion width for the greatest reduction in $C_j$.

Furthermore, the counter doped region provides flexibility in designing the S/D regions. For example, the bottom of the S/D regions can be designed with greater flexibility while increasing the widths of the depletion regions. For example, adjusting the height of the counter doped region may increase or decrease the depth of S/D regions while maintaining a fully depleted depletion region between the S/D regions and counter doped region. For example, S/D regions having shallower depths may be provided by increasing the height of the counter doped region or deeper S/D regions may be provided by decreasing the height of the counter doped region.

FIGS. 6a-b show combinations of channel (e.g., second portion of the fin), channel stressor (first portion of the fin) and S/D stressor materials for embodiments of devices. FIG. 6a shows the different combinations of materials for n-type transistors while FIG. 6b shows the different combination of materials for p-type transistors. In particular, the different materials for buried stressors and S/D stressors are provided for a Si, SiGe, Ge and GaAs channel. In some cases, the S/D stressors and the channel stressor can be of the same material. In such cases, the compositional range may be different to provide different lattice size to cause the desired first strain on the channel. It is understood that the combinations of materials examples are not meant to be exhaustive. In other embodiments, the same material of the stressor and the channel may have the same compositional range. This provides materials which are stress neutral with respect to each other. In such cases, the stressor does not serve as a stressor.

Figure 7A:
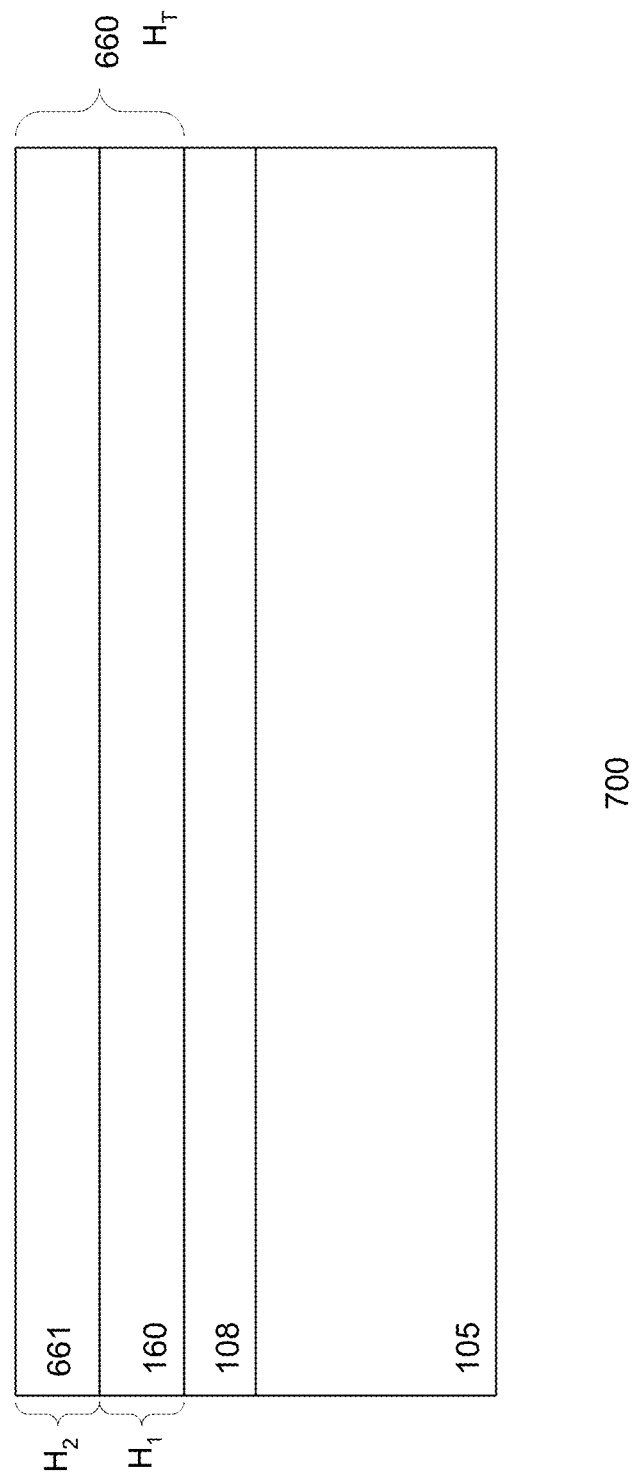
FIGS. 7a-g show cross-sectional views of an embodiment of a process for forming a device.

FIGS. 7a-g show cross-sectional views of an embodiment of a process 700 for forming a device or IC. The cross-sectional views are taken along, for example, B-B'. Referring to FIG. 7a, a substrate 105 is provided. The substrate can comprise a silicon substrate, such as a lightly p-type doped substrate. Other types of substrates, including SiGe, Ge and group III-V semiconductors such as GaAs, InP and InAs, are also useful.

The substrate may be prepared with a device region. The device region, for example, serves as a region for a transistor. In one embodiment, the device region serves as a region for a finFET. Although the substrate is described with one device region, it is understood that the substrate may include numerous device regions (not shown). The numerous device regions may include different types of device regions. For example, the substrate may include other device regions for memory cells and logic devices. The logic regions, for example, may include regions for devices, such as support devices for accessing the memory array. Additionally, the logic regions may include other types of devices, depending on the type of IC formed. The logic region, for example, may include regions for different voltage devices. For example, the logic region may include regions for high voltage devices, medium voltage devices, low voltage devices or a combination thereof. Other configurations of logic regions may also be useful.

A doped isolation well 108 is formed in the device region. The isolation well, in one embodiment, comprises dopants of a second polarity type. The depth of the doped well, for example, may be about 0.05-0.5 μm. The doped well may also have other depths. The dopant concentration of the isolation well may be about $10^{16}$-$10^{19}$ atoms/cm$^3$. Providing isolation wells having other depths and/or concentrations may also be useful. The doped well having second polarity type dopants is used for a first polarity type device. In one embodiment, the doped well comprises a p-type doped well for a n-type device. Alternatively, the doped well comprises a n-type doped well to form a p-type device. The doped well may be formed by implanting appropriate dopants with the desired dose and energy into the substrate. The dopant type, dose and energy may depend on the type of device to be formed. The doped well serves to isolate, for example, a device with a first polarity type channel from a device with a second polarity type channel. For example, a p-type doped isolation well isolates a n-type channel device from a p-type channel device or a n-type doped isolation well isolates a p-type channel device from a n-type channel device.

In one embodiment, the isolation well comprises a p-well for a n-type device. Forming a n-well for a p-type device may also be useful. The isolation well may be formed by ion implantation. For example, single or multiple implants may be performed to form the isolation well. In some embodiments, two implants may be performed to form the isolation well. Forming the isolation well using other number of implants may also be useful. Other techniques for forming the isolation well may also be employed.

The substrate may include other types of device regions for other types of devices. For example, the substrate may include p-type and n-type devices, such as high, medium and low voltage p-type and n-type devices. Various types of n-type and p-type wells are provided for these devices. The various wells may be formed by separate implantation processes using implant masks. P-type dopants can include boron (B), aluminum (Al), indium (In) or a combination thereof, while n-type dopants can include phosphorus (P), arsenic (As), antimony (Sb) or a combination thereof.

A dielectric layer 660 is formed on the substrate. The dielectric layer comprises a dielectric stack with a plurality of dielectric sub-layers. In one embodiment, the dielectric stack comprises first and second dielectric sub-layers 160 and 661. The first dielectric sub-layer, for example, is a lower dielectric sub-layer and the second dielectric sub-layer is an upper dielectric sub-layer of the stack. The dielectric sub-layers comprise materials which can be removed selectively to each other. In one embodiment, the first dielectric sub-layer comprises silicon oxide while the second dielectric sub-layer comprises silicon nitride. In other embodiments, the first dielectric sub-layer may comprise silicon nitride and the second dielectric sub-layer comprises silicon oxide. Other types of dielectric layers or stack may also be useful.

The lower dielectric sub-layer may comprise a plurality of lower dielectric sub-layers. In some cases, the upper dielectric sub-layer may include a plurality of upper dielectric sub-layers. This provides a dielectric layer having more than first and second sub-layers. In such cases, the dielectric sub-layers at the interface of the upper and lower dielectric sub-layers are of different materials, with the one below serving as an etch stop layer.

In one embodiment, the lower dielectric sub-layer comprises a second lower dielectric sub-layer over a first lower dielectric sub-layer. The second lower dielectric sub-layer may serve as the etch stop layer. The first lower dielectric sub-layer may comprise the same or different material as the upper dielectric sub-layer so long as the second lower dielectric sub-layer is different from the upper dielectric sub-layer. In one embodiment, the lower dielectric sub-layer comprises a nitride layer over an oxide layer while the upper dielectric sub-layer is an oxide layer, forming an oxide/nitride/oxide dielectric stack. The nitride layer may serve as a protective layer to prevent excessive removal of the oxide layer from, for example, a HF clean. Other configurations of the dielectric layer may also be useful.

The overall height of the dielectric layer $H_T$ is equal to $H_1+H_2$, where $H_1$ is the thickness of the lower dielectric sub-layer and $H_2$ is the thickness of the upper dielectric sub-layer. In one embodiment, $H_2$ determines the height of the device. For example, $H_2$ determines the height of the fin type device. In other embodiments, $H_2$ factors in determining the height of the fin type device. The height $H_2$ may be equal to about 10-100 nm. In other embodiments, $H_2$ may be about 20-80 nm or 20-50 nm. As for $H_1$, it may be about 30-500 nm. In other embodiments, $H_1$ may be about 30-100 nm. Other values for $H_1$ and $H_2$ may also be useful. For example, the values of $H_1$ and $H_2$ may be selected based on design requirements. In the case where the lower dielectric sub-layer includes multiple layers, the total thickness of the lower dielectric sub-layers may be $H_1$. In the case where the upper dielectric sub-layer includes multiple layers, the total thickness of the upper dielectric sub-layers may be $H_2$. Other configurations of the heights of the upper and lower dielectric sub-layers may also be useful. In some embodiments, the interface of $H_1$ and $H_2$ is employed to determine the height of the device.

Figure 7B:
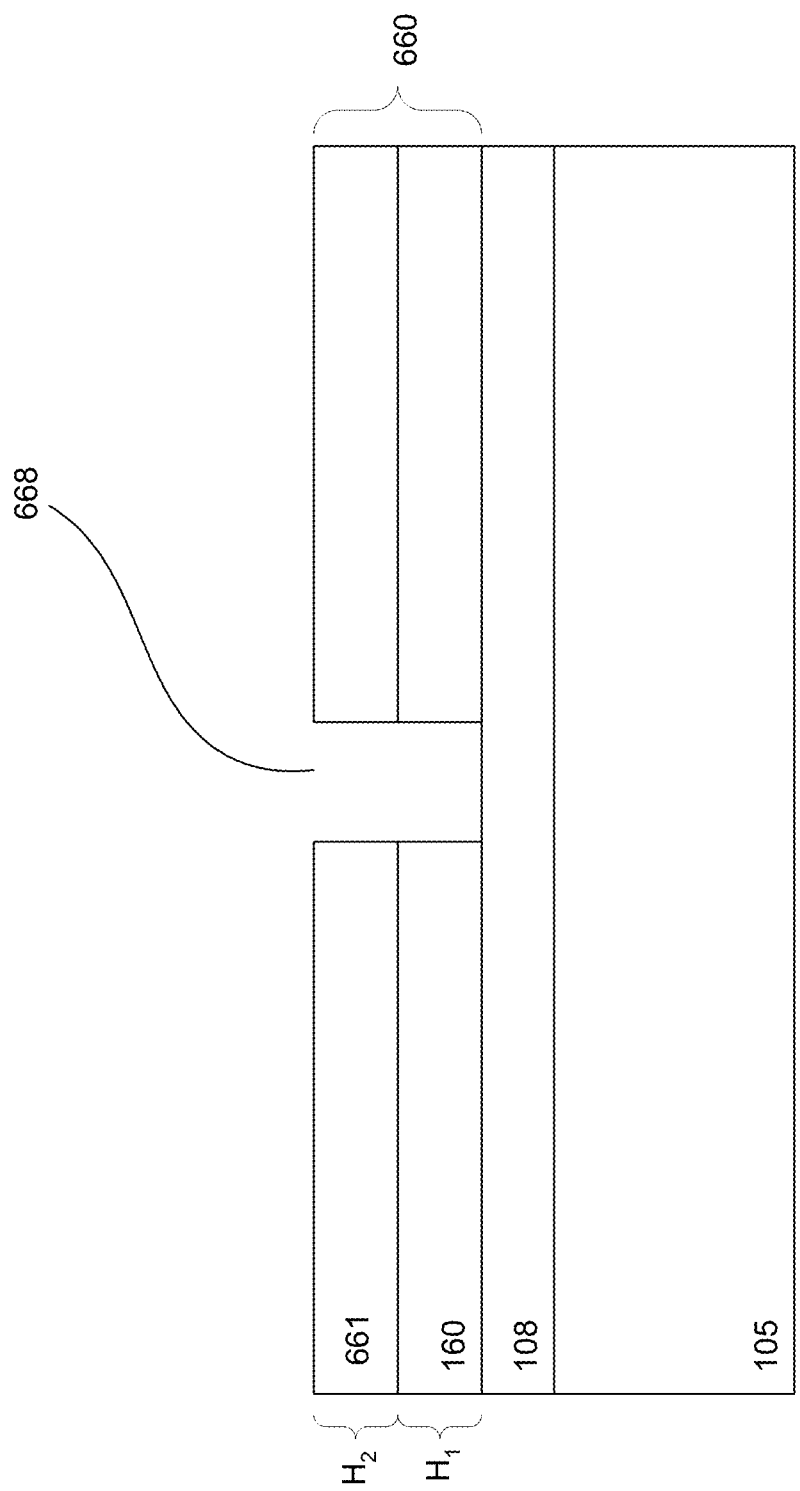

Referring to FIG. 7b, the dielectric layer is patterned to form an opening 668, exposing the substrate. The opening corresponds to a fin structure which is to be formed on the substrate. In one embodiment, the opening includes the S/D contact pads at ends of the fin. Patterning of the opening may be achieved using mask and etch techniques. For example, a mask, such as photoresist, may be selectively patterned to create an opening to expose a portion of the dielectric layer corresponding to the opening. An anisotropic etch, such as a reactive ion etch (RIE), may be performed to remove the exposed portions of the dielectric layer to form the opening. This exposes the substrate in the opening. To improve lithographic resolution, an anti-reflective coating (ARC) can be provided beneath the photoresist. Other techniques for patterning the dielectric layer may also be useful. After patterning the dielectric layer, the mask, including ARC layer may be removed.

Figure 7C:
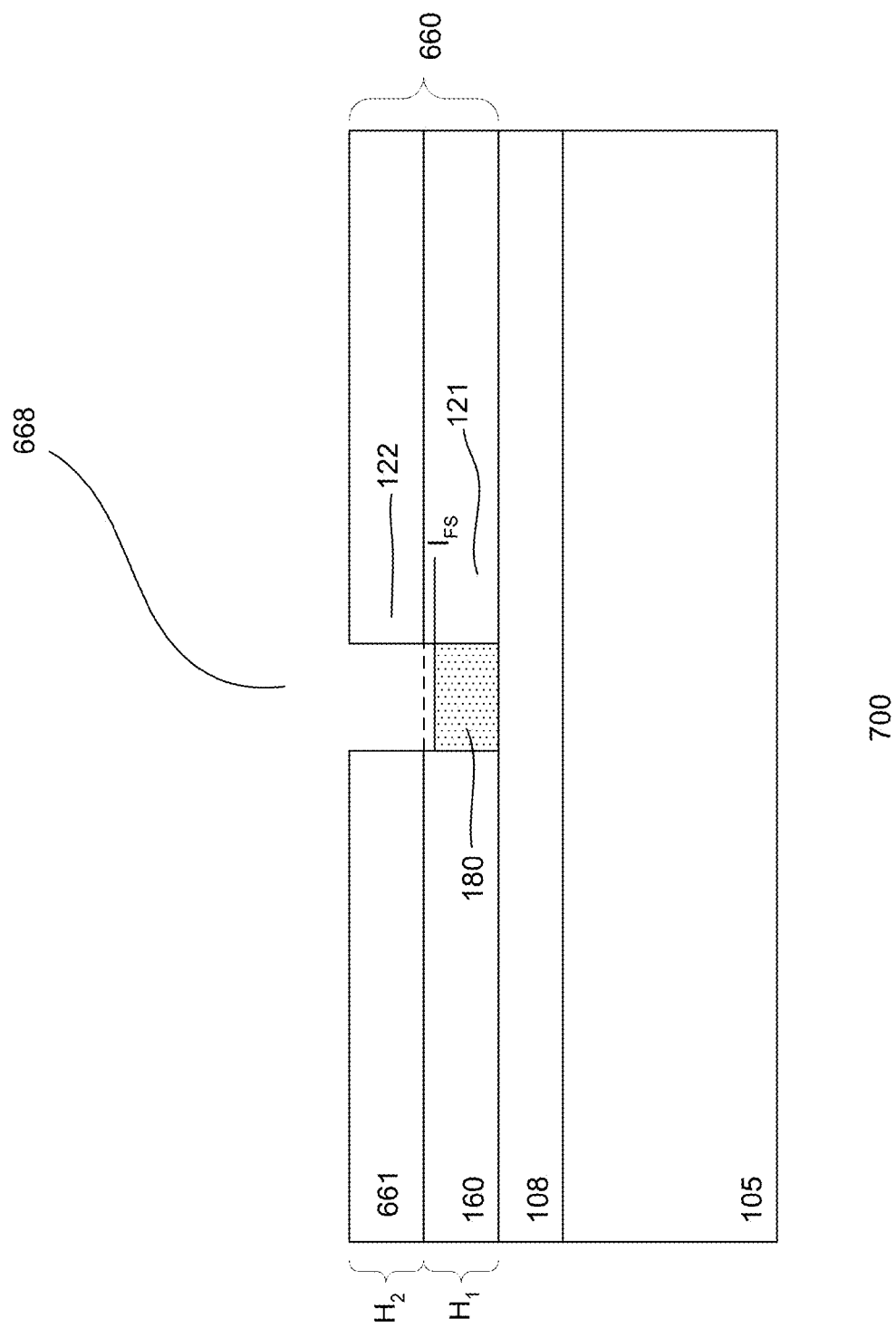

The opening may be virtually divided into first and second portions 121 and 122, as shown in FIG. 7c. The first portion, for example is below the second portion. An interface $I_{FS}$ of the first and second portions may define, in one embodiment, a top of a buried stressor. The interface $I_{FS}$ can be disposed in different locations of the fin structure. As shown, $I_{FS}$ is located below the interface of the first and second dielectric sub-layers 160 and 661, as indicated by the dotted line (e.g., bottom and top device portions of the fin). In other embodiments, $I_{FS}$ may be located at or above the interface of the first and second dielectric sub-layers.

The first portion of the opening forms a first portion of the fin structure while the second portion of the opening forms a second portion of the fin structure. In one embodiment, the first portion serves as a stressor portion of the fin structure and the second portion serves as a non-stressor portion of the fin structure and is the portion to be strained. A crystalline layer is provided in the opening. The crystalline layer fills the first portion of the opening, forming the first portion of the fin structure. In one embodiment, the crystalline layer is formed by epitaxial growth, providing an epitaxial crystalline layer to serve as the first portion of the fin structure. The epitaxial growth, for example, may comprise SEG.

In one embodiment, the crystalline material, for example, serves as a buried stressor to cause a channel in the second portion of the fin to have a first stress. In one embodiment, the epitaxial crystalline layer has a different lattice size as the second portion of the fin. Various types of crystalline layer may be useful, depending on, for example, the desired first stress on the channel and material of the second portion. The crystalline material, for example, may comprise Si, Ge, SiGe, SiGe:C, SiGeSn, GeSn, SiC, GaAs or a combination thereof. Other types of crystalline materials may also be useful.

In other embodiments, the stressor may be formed using different techniques. For example, the stressor may be formed by depositing an amorphous layer to fill the opening and recrystallizing the amorphous layer to form a recrystallized crystalline layer. The recrystallized crystalline layer may be etched back to recess it to $I_{FS}$. Other techniques for forming the buried stressor may also be useful.

Figure 7D:
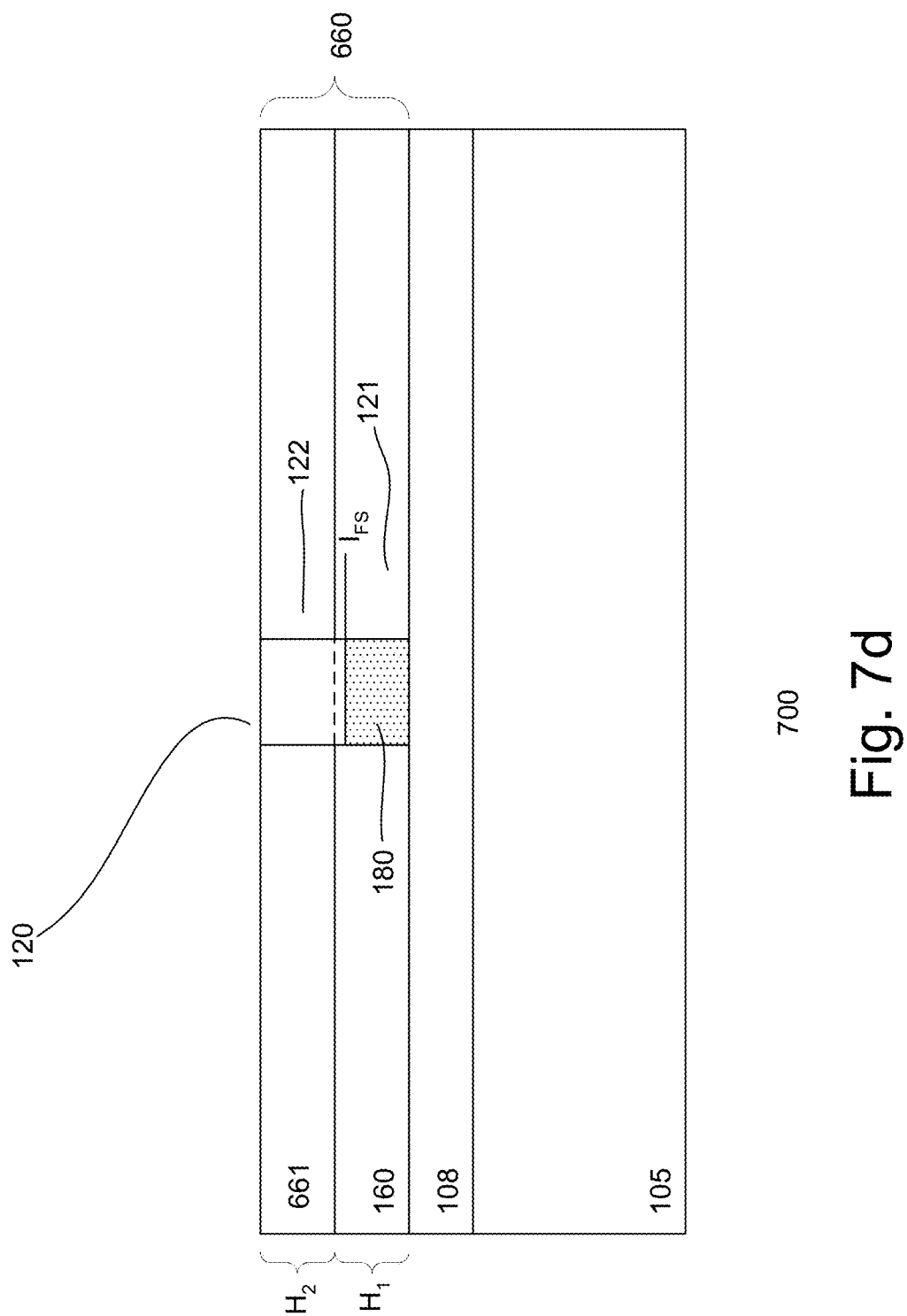

In FIG. 7d, the process continues to complete the formation of the fin structure. For example, the fin structure in the second portion of the opening is formed. The remaining portion of the fin structure may include epitaxial crystalline material, recrystallized crystalline material or a combination thereof.

In one embodiment, the second portion of the opening is filled with an amorphous layer. The amorphous layer, for example, overfills the opening. Excess material above the dielectric layer is removed. For example, the excess material over the dielectric layer above the opening is removed. Removing the excess material, in one embodiment, comprises a planarizing process, such as chemical mechanical polishing (CMP). Other types of planarizing processes may also be useful. For example, a reflow process may be employed. The planarizing process forms a planar top surface between the dielectric layer and semiconductor material filling the opening.

The amorphous layer is annealed to form a crystalline layer. The anneal, for example, recrystallizes the amorphous layer to form a single or substantially single crystalline layer. Various types of anneals may be employed. For example, the anneal could be a thermal anneal, a rapid thermal anneal (RTA) or a laser anneal. In one embodiment, the anneal may be performed at a temperature of 600-800° C. for about 10-30 minutes. This forms a fin structure 120. In one embodiment, this forms a fin structure with contact pads.

In other embodiments, the amorphous layer may be recrystallized prior to removing excess material to form a planar surface with the surface of the dielectric layer.

In alternative embodiments, the opening is filled with a crystalline material. In one embodiment, the opening is filled with an epitaxial crystalline layer. The epitaxial layer may be formed by selective epitaxial growth (SEG). For example, the opening is filled with an epitaxial layer by SEG. The SEG layer may be formed to provide a planar surface with the top of the dielectric layer. In other embodiments, the SEG layer may be formed, for example, slightly below the top surface of the dielectric layer.

SEG can be used to control the height of the upper portion of the layer above the interface of $H_1$ and $H_2$. In the case where it is coplanar or substantially coplanar with the top surface of the dielectric layer, the height is equal to about $H_2$. Alternatively, for the case where it is below the top surface of the dielectric layer, the height is equal to the growth of the epitaxial layer above the interface of $H_1$ and $H_2$.

In one embodiment, the epitaxial layer is formed with over growth above the top surface of the dielectric layer. The over growth may be removed by, for example, CMP to form a coplanar surface with the dielectric layer. This enables $H_2$ to define the height of the device. In some other embodiments, CMP may be employed for the case without over growth. For example, CMP may be employed for the case where the SEG layer is grown to or below the top surface of the dielectric layer. It is, however, understood that CMP is not necessary for such embodiments. In the case where the SEG layer is formed with a top surface below the top surface of the dielectric layer, the height of the device is determined by the interface of $H_1$ and $H_2$ as well as the growth of the SEG layer.

In other embodiments, the second portion of the fin structure may be formed with a combination of epitaxial and recrystallized materials. For example, the epitaxial layer may be formed in a lower second portion of the fin structure and a recrystallized material is formed in an upper second portion of the fin structure. Forming a fin structure with other configurations of epitaxial and recrystallized material may also be useful.

The crystalline material of the second portion of the fin structure may be silicon. Other types of crystalline material may also be useful. For example, the second portion may comprise Ge, SiGe, GaAs or a combination thereof, including Si.

Figure 7E:
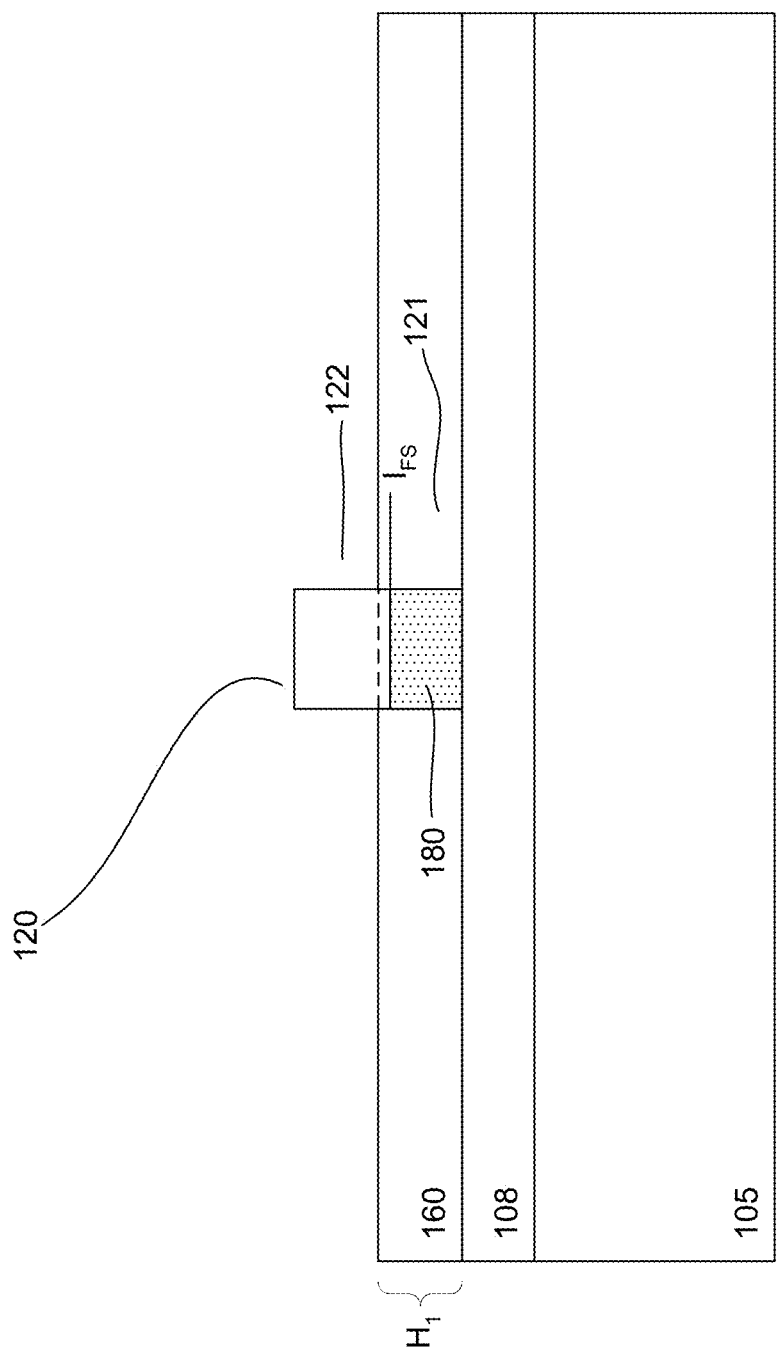

Referring to FIG. 7e, the second dielectric sub-layer is removed selective to the first dielectric sub-layer. This leaves the first dielectric sub-layer 160 on the substrate. The selective removal of the second dielectric sub-layer may be achieved, for example, by a wet etch. Other techniques, including an anisotropic etch, such as RIE, may also be employed. The selective removal of the second dielectric sub-layer leaves the first dielectric sub-layer with a non-selectively etched top surface.

A portion of the fin extends above the first dielectric sub-layer. For example, the height of the portion of the fin extending above the first dielectric sub-layer determines the device height. The height of the device may be equal to $H_2$ or other heights. For example, the height of the device may be determined by SEG of the fin structure or by over polishing of the fin structure. An anneal may be optionally performed after removing the second dielectric sub-layer. The anneal, for example, is performed in a hydrogen (H$_2$) ambient to smoothen the fin and passivate dangling bonds. Other types of anneals may also be useful.

Figure 7F:
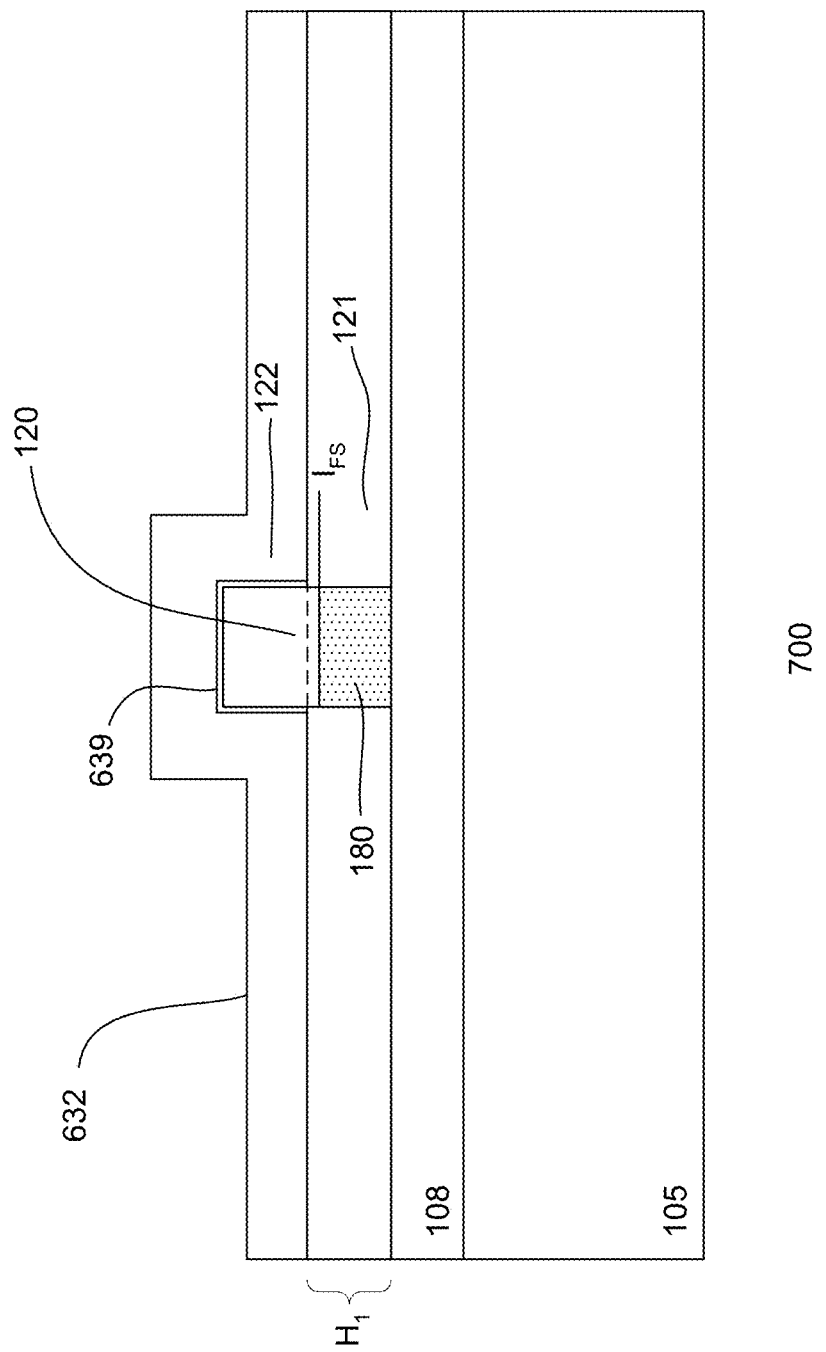

As shown in FIG. 7f, a gate oxide layer 639, in one embodiment, is formed on the exposed surfaces of the fin structure, including the contact pads. The gate oxide layer, for example, comprises silicon oxide. In one embodiment, the gate oxide layer is formed by thermal oxidation. The thermal oxidation may be performed in an oxidizing ambient, such as O$_2$. The oxidizing ambient may also include N$_2$. This forms a thermal silicon oxide layer on the surfaces of the fin structure. Forming other types of gate oxides or using other techniques to form the gate oxide layer may also be useful. For example, the process of forming a gate oxide may form SiON, HfO$_2$ or HfSiON or other types of gate oxide layer. The thickness of the gate oxide layer may be, for example, about 10-100 Å. Other gate oxide thicknesses may also be useful.

A gate electrode layer 632 is formed on the substrate, covering the dielectric layer and gate oxide layer. The gate electrode layer, for example, comprises polysilicon. The gate electrode layer may be formed by, for example, CVD. The thickness of the gate electrode layer, for example, may be about 400-1000 Å. Other types of gate electrode layers, thicknesses or techniques for forming the gate electrode layer may also be useful. For example, the gate electrode layer may comprise TaN, TiN or other types of gate electrode material or may be formed by techniques such as atomic layered deposition (ALD) or sputtering.

The gate layer may be doped to reduce resistance, adjust $V_T$, adjust work function or a combination thereof. The type of dopants and dopant concentration may be appropriately selected based on the design requirements. The gate layer may be in situ doped during formation or doped by ion implantation after the formation of the gate electrode layer.

Figure 7G:
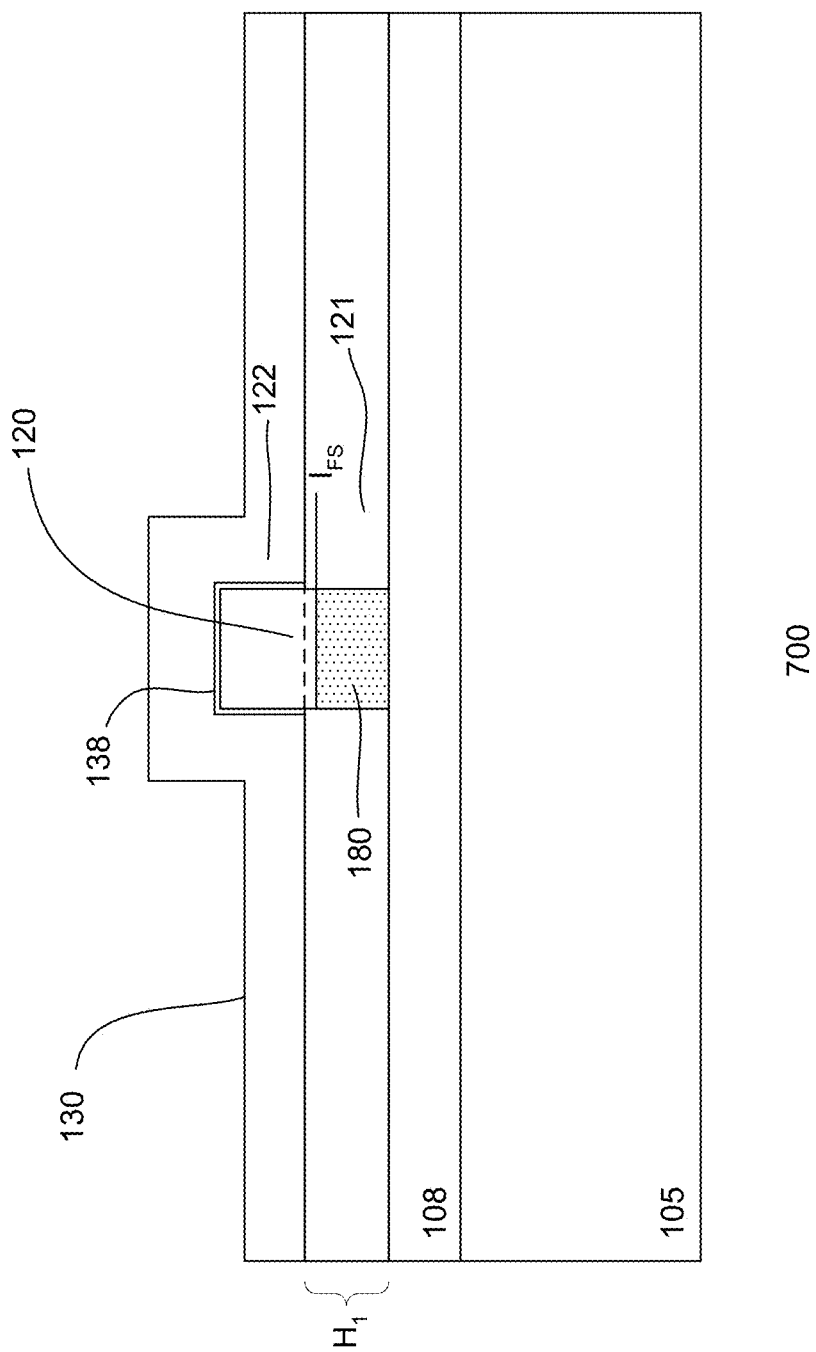

Referring to FIG. 7g, the gate electrode layer and gate oxide layer are patterned to form a gate stack having a gate electrode 130 over a gate dielectric 138 which traverses the fin 120. Patterning of the gate electrode layer may also form the gate contact.

Mask and etch techniques may be employed to form the gate stack. For example, a patterned photoresist mask may be used as an etch mask for a RIE to form the gate stack. To improve lithographic resolution, an ARC can be provided beneath the photoresist. Other techniques for patterning the dielectric layer may also be useful. After patterning the substrate to form the gate stack, the mask, including the ARC layer may be removed.

The process continues, for example, to form S/D regions in the fin structure adjacent to the gate. The S/D regions comprise first polarity type dopants. In one embodiment, lightly doped S/D extension regions are formed, for example, by ion implantation. The extensions are formed by, for example, implanting first polarity type dopants. The process parameters of the implantation, such as dose and energy, may be appropriately selected based on design requirements.

After the extension regions are formed, gate sidewall spacers may be formed on sidewalls of the gate. The gate sidewall spacers, for example, comprise silicon nitride. Other types of spacer materials, such as silicon oxide or silicon oxynitride, may also be useful. To form sidewall spacers, a spacer dielectric layer is deposited on the substrate. The spacers can be formed by using various techniques, such as plasma enhanced chemical vapor deposition (PECVD). Other techniques to form the spacer dielectric layer or forming other types of spacers may also be useful. The spacer dielectric layer is subsequently anisotropically etched, such as by RIE, to remove horizontal portions, leaving non-horizontal portions on the sidewalls as the spacers.

Heavily doped S/D regions with first polarity type dopants are formed. The heavily doped S/D regions are formed by, for example, implanting first polarity type dopants. The process parameters of the implantation, such as dose and energy, may be appropriately selected based on design requirements. In some embodiments, the S/D extension regions may be formed along with forming the S/D regions after spacer formation. Silicide contacts may be formed on the contact regions of the device, such as S/D contact regions and gate contacts regions.

The process further continues to form, for example, a dielectric layer. The dielectric layer may be a pre-metal dielectric (PMD) layer. Contacts to the contact pads may be formed in the transistor. Additional processes may include forming of one or more interconnect levels, final passivation, dicing, assembly, packaging and testing. Other processes are also useful. For example, other components, such as low voltage, medium voltage, and high voltage I/O devices can be formed prior to forming the interconnections.

In some embodiments, the buried stressor 180 may be doped to form a counter doped region. The counter doped region, for example, comprises first polarity type dopants, which is the same as the subsequently formed S/D regions and opposite of the isolation well. In one embodiment, the counter doped region may be a lightly or intermediately doped region. For example, the dopant concentration of the counter doped region may be about $1E10^{18}$ atoms/cm$^3$. Other dopant concentrations may also be useful.

The top of the counter doped region may be disposed above, below or at $I_{FS}$. The counter doped region is separated from the S/D regions by an intermediate region which serves as a depletion region. The height of the depletion region should be selected to enable the depletion regions of the counter doped region and S/D regions to merge, for example, at zero bias. For example the depletion region is a fully depleted region at zero bias. The height of the depletion region can be tuned based on the doping of the S/D regions and counter doped region to provide a fully depleted region. The depletion region may be disposed in the second portion, the first portion or a combination thereof. For example, the depletion region may overlap the first and second portions of the fin structure.

The counter doped region may be formed by, for example, in situ doping. For example, an epitaxial crystalline stressor may be in situ doped up to the desired point. In the case wherein the top of the counter doped region is below the first portion of the fin structure, in situ doping may stop at the desired point while the stressor continues to form. In other embodiments, in situ doping may continue when forming the epitaxial crystalline fin in the non-stressor portion until the desired height of the counter doped region is reached. The second portion may continue by epitaxial growth or by other techniques. In other embodiments, the counter doped region may be formed by ion implantation after the stressor is formed. In one embodiment, the dopant concentration is consistent throughout the counter doped region. For example, no tailing off of dopants occur at or near the bottom of the counter doped region. This reduces random-dopant-fluctuation (RDF), which can undesirably cause variations in $V_T$.

In the case of in situ doping, the counter doped region is disposed below the S/D regions and the channel. This forms a silicon on depletion layer (SODEL) device. In the case of ion implantation, a SODEL device may be formed in the case wherein an implant mask exposes the S/D regions and the channel. Alternatively, the implant mask may expose the S/D regions while leaving the channel protected. This forms a Source/Drain on depletion layer (SDODEL) device. After the fin structure with the counter doped region is formed, the process continues as described from FIG. 7d onwards.

As described, the dielectric layer on the substrate has a non-selectively etched top surface. The dielectric layer with the non-selectively etched top surface enables the top device portion of the fin structures to be more consistent from fin structure to fin structure across the wafer. Since the top portion of the fin structure determines the height of the device, reducing height variations of the top portion of the fin structures results in more consistent device characteristics across the wafer.

Figure 8B:
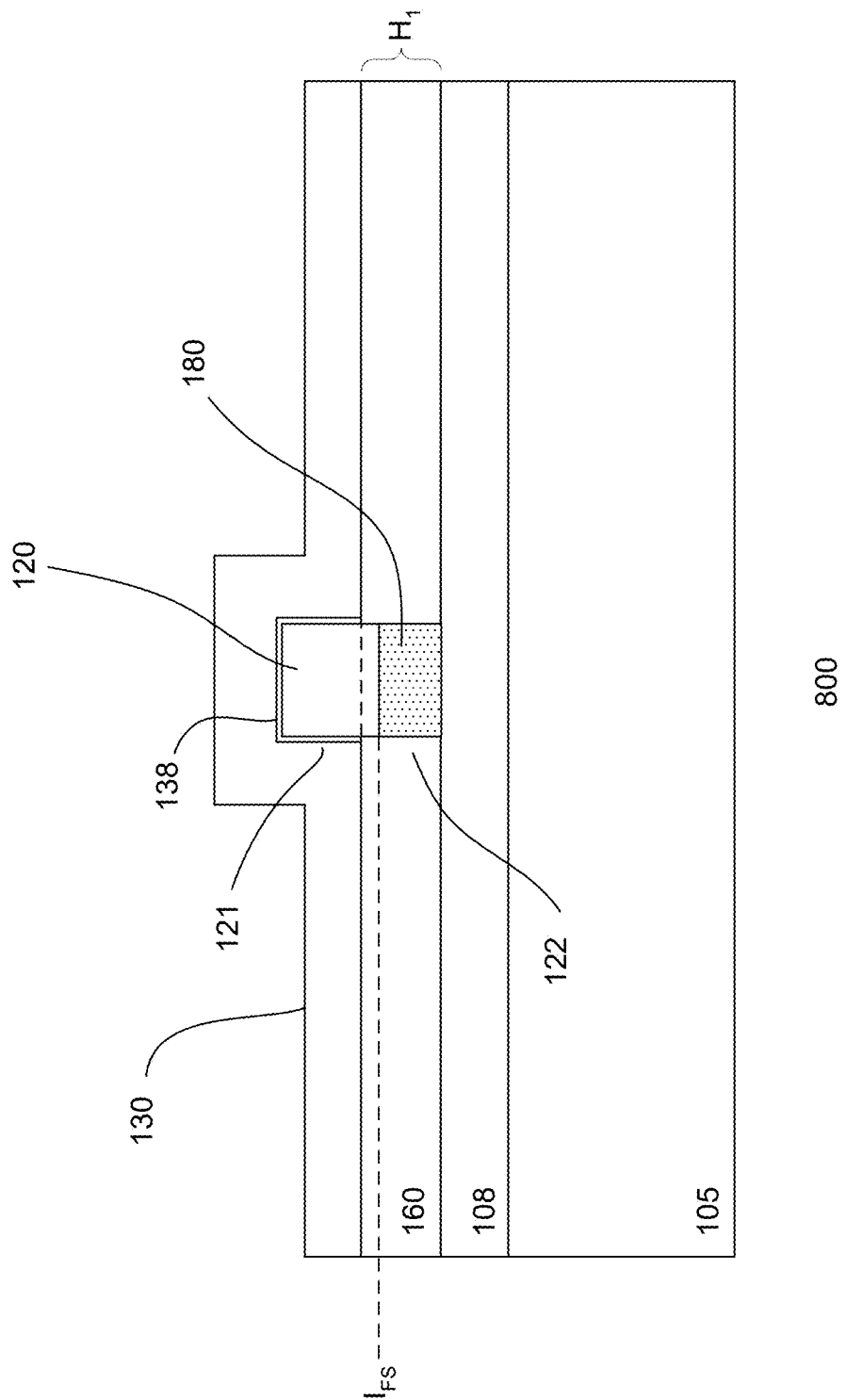
Figure 8C:
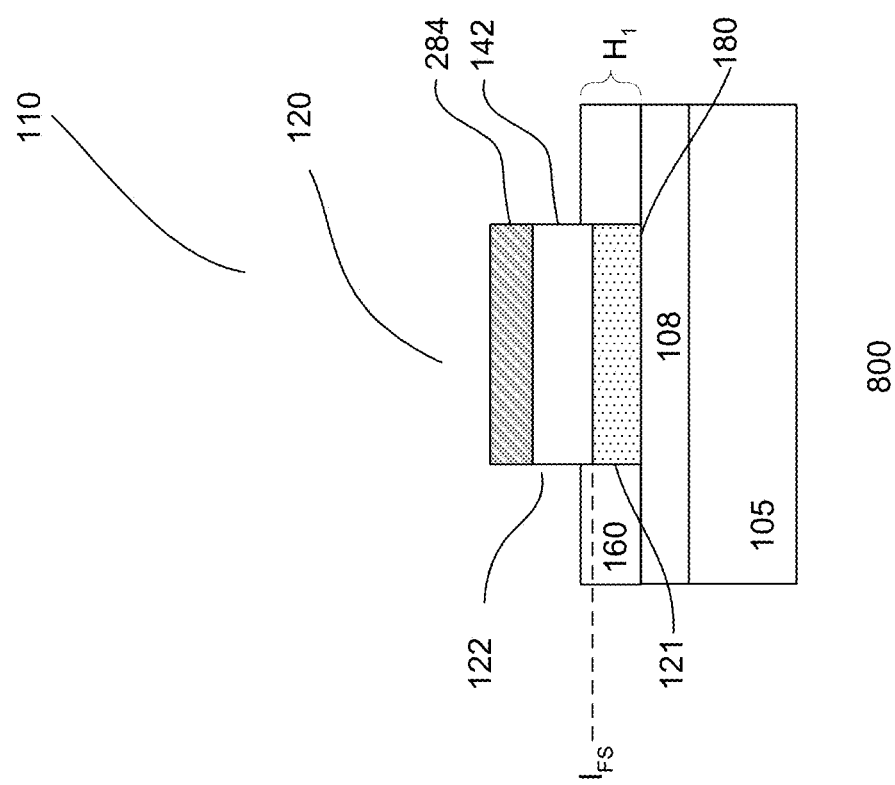
Figure 8D:
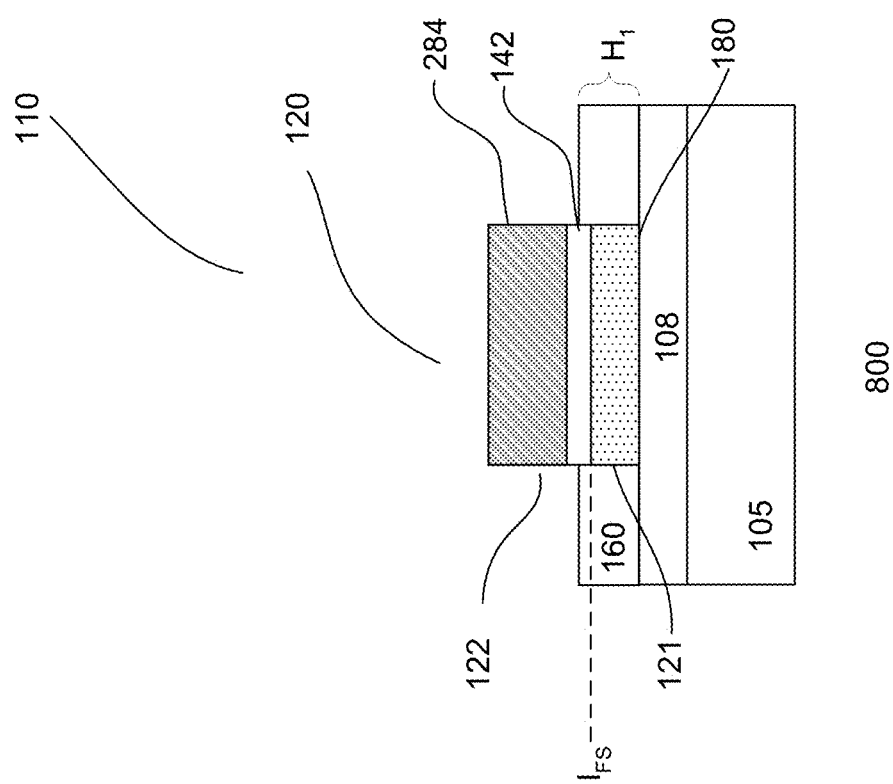

FIGS. 8a-d show cross-sectional views of other processes 800 for forming a device or IC. The cross-sectional views of FIGS. 8a-b are taken along B-B' while cross-sectional views of FIGS. 8c-d are taken along D-D'.

FIG. 8a shows the substrate processed similarly to the stage as described in FIG. 7e. For example, a fin structure 120 includes a second portion 122 over a first portion 121. The first portion includes a buried stressor 180. As such, the common features need not be discussed.

In FIG. 8b, a gate oxide layer 138 is formed on the fin structure and a gate electrode layer 130 is formed on the substrate covering the fin structure and dielectric layer. The gate oxide layer, for example, comprises silicon oxide. In one embodiment, the gate oxide layer is formed by thermal oxidation. The thermal oxidation may be performed in an oxidizing ambient, such as $O_2$. The oxidizing ambient may also include $N_2$. This forms a thermal silicon oxide layer on the surfaces of the fin structure. Forming other types of gate oxide or using other techniques to form the gate oxide layer may also be useful. For example, the process of forming a gate oxide may form SiON, $HfO_2$ or HfSiON or other types of gate oxide layer. The thickness of the gate oxide layer may be, for example, about 10-100 Å. Other gate oxide thicknesses may also be useful. The gate electrode layer, for example, comprises polysilicon. The gate electrode layer may be formed by, for example, CVD. The thickness of the gate electrode layer, for example, may be about 400-1000 Å. Other types of gate electrode layers, thicknesses or techniques for forming the gate electrode layer may also be useful. For example, the gate electrode layer may comprise TaN, TiN or other types of gate electrode material or may be formed by techniques such as atomic layered deposition (ALD) or sputtering. The gate electrode layer and dielectric layer are patterned to form a gate 130 with a gate dielectric 138 therebetween.

Referring to FIG. 8c, S/D stressors 284 are formed on the S/D regions. The S/D stressors may also be formed on the S/D contact regions. The S/D stressors are disposed on the fin structure and S/D contact regions, forming raised S/D stressors. In one embodiment, the S/D stressors comprise a stressor material to cause a first strain in the channel of the device. The S/D stressors cause a first strain in the channel from above. The strained channel enhances carrier mobility to improve device performance. The first strain may also depend on the device orientation as well as the type of material used to form the channel of the device, such as the at least a sub-portion of the second portion of the fin structure. For example, the first strain may be a tensile strain for a n-type silicon device or compressive strain for a p-type silicon device. The strain may either be biaxial, uniaxial or a combination thereof. Other configurations of strain may also be useful.

In one embodiment, the S/D stressors comprise a crystalline material. To cause a strain on the channel, the stressors should have a crystal lattice which is larger or smaller than the crystal lattice of the second portion of the fin structure. In one embodiment, the stressors produce a uniaxial first strain on the surface or surfaces of the fin structure. In one embodiment, the stressors produce a uniaxial first strain on the top and side surfaces of the fin structure. The first strain may be compressive for S/D stressors which have a larger crystal lattice than the crystal lattice of the second portion of the fin structure. On the other hand, the first strain may be a tensile strain if the crystal lattice of the S/D stressors is smaller than the crystal lattice of the second portion of the fin structure. The crystalline material of the S/D stressors may be, for example, Si, Ge, SiGe, SiGe:C, SiGeSn, GeSn, SiC, GaAs, or a combination thereof. Other types of materials may also be useful. The material selected may depend on, for example, the desired strain in the channel and material of the channel (e.g., second portion).

In one embodiment, the raised S/D stressors are formed by epitaxial growth. The raised S/D stressors, in one embodiment, are formed by SEG. The stressors are selectively formed on the exposed fin structure adjacent to the gate. The stressors, for example, are selectively formed on the exposed fin structure adjacent to the gate, including the S/D contact regions. In one embodiment, the raised S/D stressors are doped with first polarity type dopants. For example, the raised S/D stressors are heavily doped with first polarity type dopants. The S/D stressors may be doped by in situ doping or by ion implantation. In some embodiments, an anneal may be performed to diffuse the dopants to form S/D extension regions. Other techniques for forming raised S/D regions may also be useful.

In an alternative embodiment, embedded S/D regions 284 are formed on the S/D regions, as shown in FIG. 8d. To form embedded raised S/D regions, the fin structure may be etched to form S/D recesses. The S/D recesses may be formed by for example, an anisotropic etch, such as RIE. The etch may be self-aligned. For example, the etch may etch exposed portions of the fin structure selective to, for example, the gate and dielectric layer 160. In one embodiment, the S/D recesses are shallower than the depth of the S/D regions. In other embodiments, the S/D recesses may be the same or deeper than the S/D regions. Providing S/D recesses having other depths may also be useful. Embedded S/D stressors are then formed in the S/D recesses, similar to the S/D stressors of FIG. 8c. In one embodiment, the embedded S/D stressors are formed to have a top surface above the top surface of the fin structure, forming embedded raised S/D stressors. Providing a top surface of the embedded S/D stressors which is not above the top surface of the fin structure may also be useful.

The process may continue, as previously described, to complete the device.

In alternative embodiments, the fin structure of FIGS. 8a-d may not include a buried stressor in the first portion thereof. In some embodiments, the fin structure of FIGS. 8a-d may be provided with a counter doped region, as previously described. In yet other embodiments, the fin structure of FIGS. 8a-d may be provided with both a counter doped region and a buried stressor.

Figure 9B:
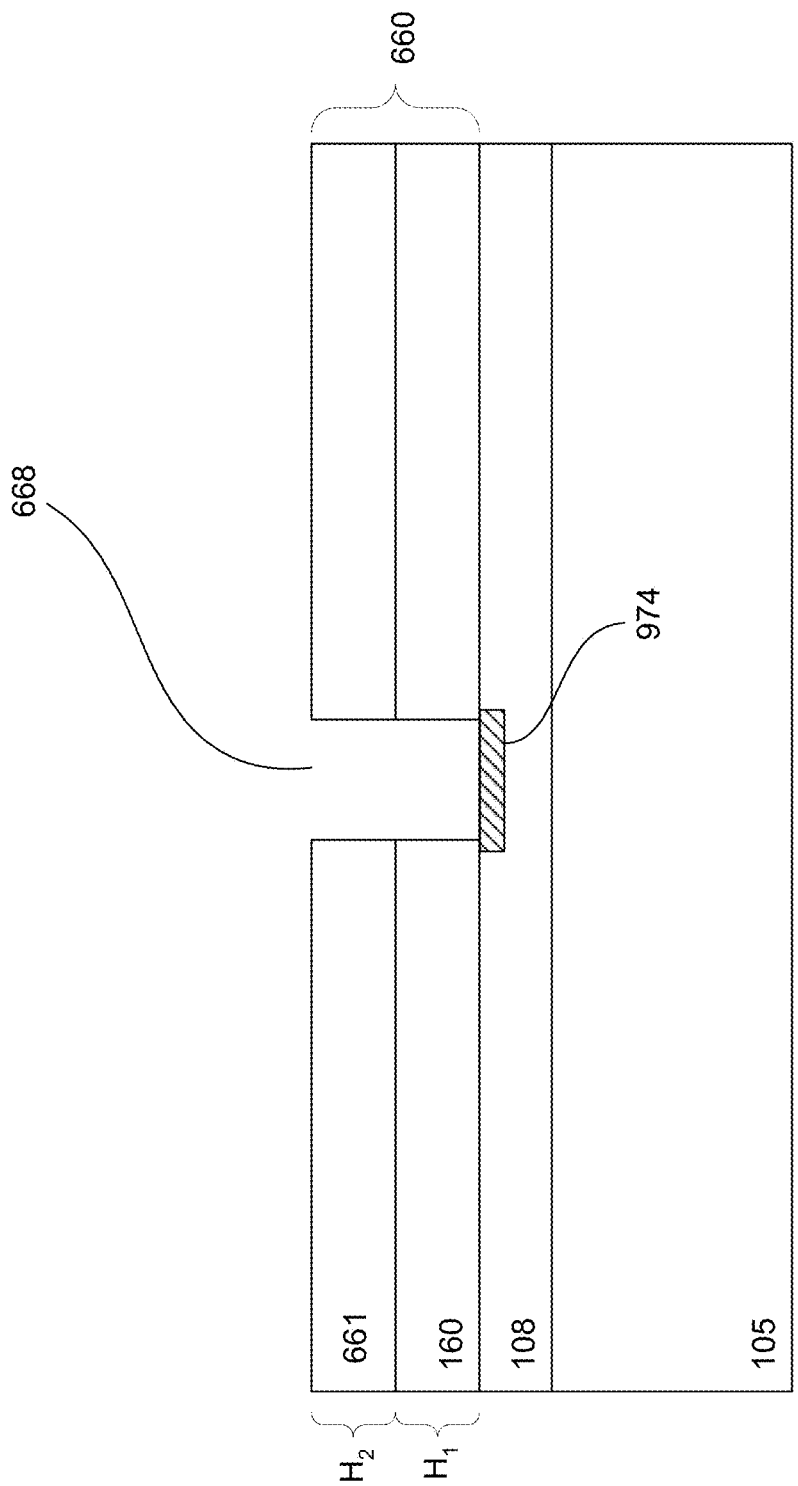

FIGS. 9a-b show cross-sectional views of an embodiment of another process 900 for forming a device or IC. The cross-sectional views are taken along, for example, B-B'. Referring to FIG. 9a, a partially processed substrate 105 is provided. The substrate is at a stage of processing as similarly described in FIG. 7b. As such, the common features need not be discussed. For example, the substrate is prepared with a dielectric stack 660 with an opening 668 corresponding to a fin structure. The opening may also include S/D contact regions.

Referring to FIG. 9b, a counter doped well 974 is formed in an upper portion of the isolation well 108 in the substrate 105. The counter doped well comprises first polarity type dopants. The first polarity type is the same polarity type as the subsequently formed S/D regions of the device and is the opposite polarity type of the isolation well. In one embodiment, the counter doped well may be a lightly or intermediately doped well. For example, the dopant concentration of the counter doped well may be about $1E10^{18}$ atoms/cm$^3$. Other dopant concentrations may also be useful.

In one embodiment, the counter doped well is formed by ion implantation. The ion implantation, for example, uses the patterned dielectric stack as an implant mask. The implant parameters may be selected to produce a counter doped well having a desired depth and dopant concentration. The counter doped well, for example, is the substrate below the opening, which is below the subsequently formed fin structure, including the S/D regions and the channel. This, for example, produces a SODEL device.

In an alternative embodiment, an implant mask is provided on the patterned dielectric stack. The implant mask provides openings to the substrate below the S/D regions but protecting the channel region of the device. The ion implantation is performed using the implant mask to form first and second counter doped wells in the substrate below the opening in the dielectric layer, which are separated below the channel region. This forms a SDODEL device. The implant mask, for example, is removed after forming the counter doped wells.

The process continues as described in FIG. 7c and onwards. A lower portion of the fin structure serves as an intermediate region between the S/D regions and counter doped well. The intermediate region serves as, for example, a depletion region. The height of the intermediate portion should be selected to enable the depletion regions of the S/D regions to merge with the depletion region of the counter doped well at zero bias. For example, at zero bias between the S/D regions and the counter doped well, their depletion regions merge. The height of the intermediate portion may depend on the doping of the counter doped well and the S/D regions. The height of the first portion can be tuned based on the doping of the S/D regions and counter doped well to provide a fully depleted region. The depletion region may be disposed in the second portion, the first portion or a combination thereof. For example, the depletion region may overlap the first and second portions of the fin structure.

By providing a counter doped well or wells, the depletion regions of the S/D regions can be extended deeper to increase their widths. Increasing the widths of the depletion regions reduces the junction capacitance $C_j$ of the device. The larger the separation between the counter doped well(s) and the S/D regions while maintaining the merger of the depletion regions, the greater the reduction in $C_j$. Preferably, the thickness of the first portion should be as large as possible while maintaining the merger of the depletion regions to produce the largest depletion width for the greatest reduction in $C_j$.

The fin structure 120 may be formed with a buried stressor, as described FIGS. 7c-d. The buried stressor may include a counter doped region, as previously described with respect to FIGS. 7a-g. In an alternative embodiment, the fin structure may include S/D or embedded S/D S/D stressors, as described in FIGS. 8a-d. Other combinations of a buried stressor, S/D or embedded S/D stressors, a counter doped region and counter doped well may also be useful.

The process may continue, as previously described, to complete the device.

Figure 10A:
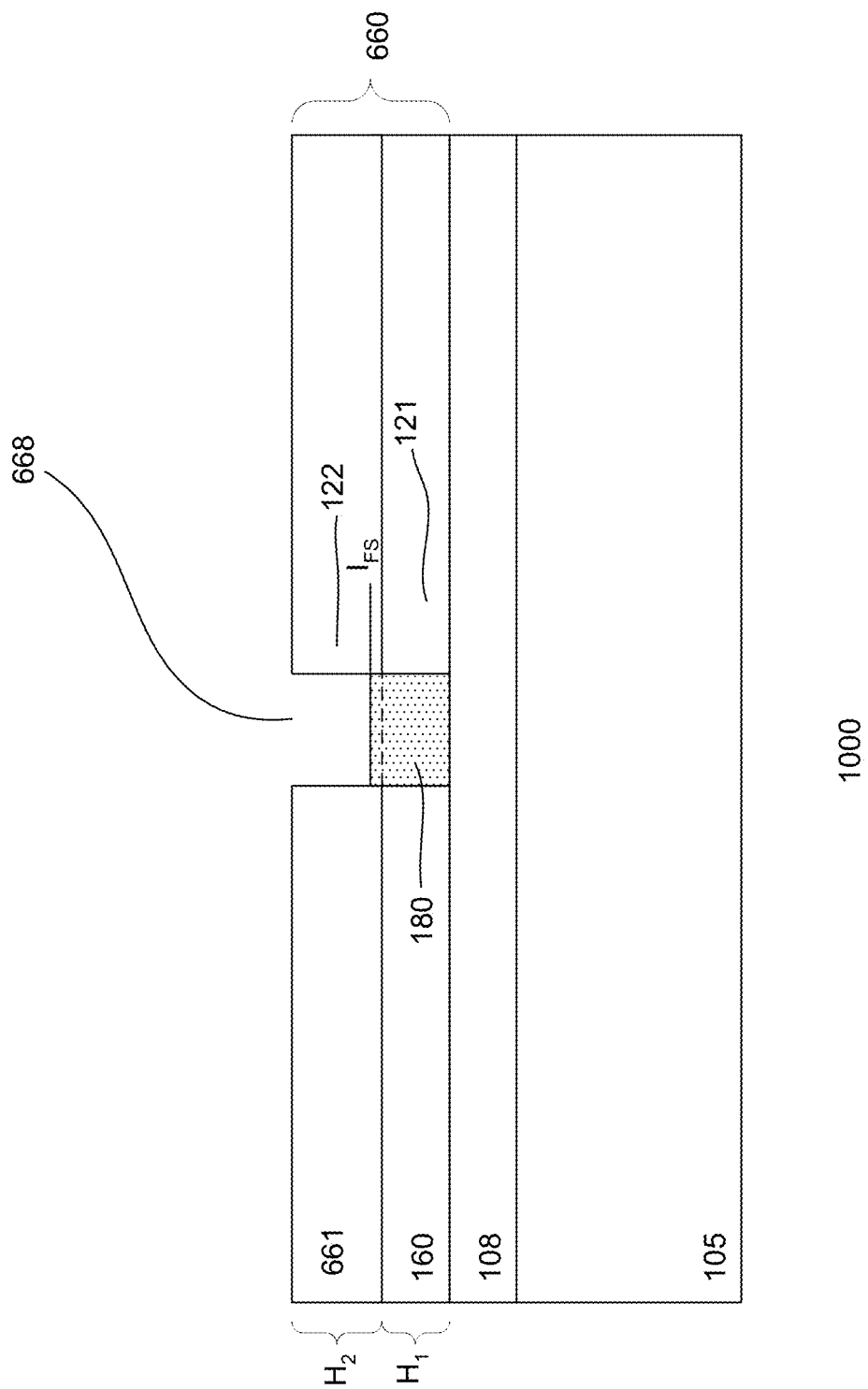
FIGS. 10a-e show cross-sectional views of another embodiment of a process for forming a device.

FIGS. 10a-e show cross-sectional views of another embodiment of a process 1000 for forming a device or IC. The cross-sectional views are taken along, for example, B-B'. Referring to FIG. 10a, a partially processed substrate 105 is provided. The substrate is at a stage of processing similar to that described in FIG. 7c. As such, the common features need not be discussed. For example, the substrate is prepared with a dielectric stack 660 having a first material formed in a first portion 121 of the opening 668. The first material forms a first portion of the fin structure. In one embodiment, the first material forms a buried stressor 180 in the first portion of the fin structure. For example, the first material may comprise a crystalline material which forms the buried stressor. An interface $I_{FS}$ separates the first portion from a second portion 122 of the opening. In one embodiment, $I_{FS}$ is disposed above the interface of the first and second dielectric layers 160 and 661 of the dielectric stack.

Figure 10B:
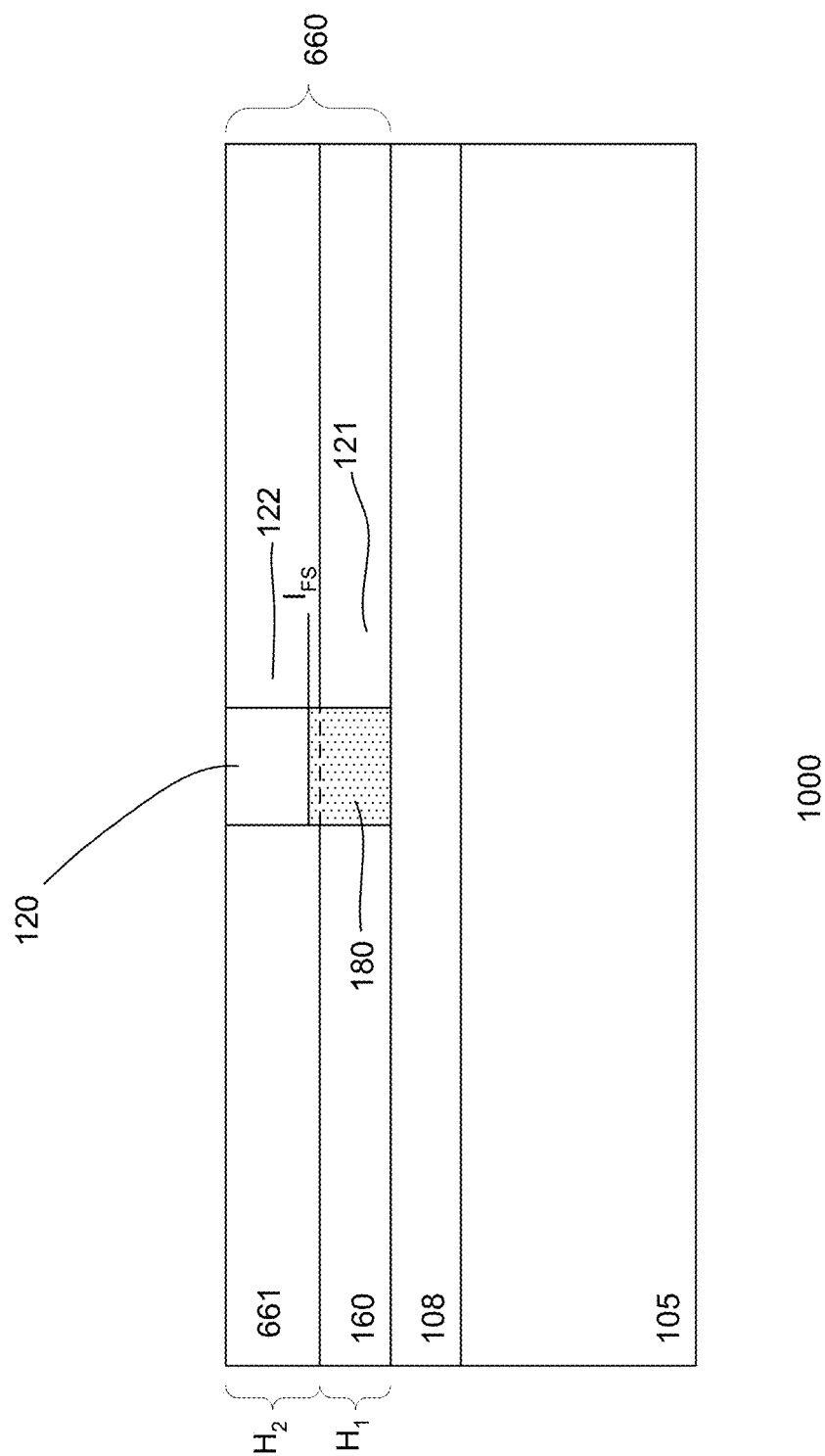

As shown in FIG. 10b, the second portion of the opening is filled with a second material which forms an upper portion 122 of the fin structure, similar to that described in FIG. 7d. In one embodiment, the second material comprises a crystalline material. For example, the first material comprises a first crystalline material and the second material comprises a second crystalline material.

In some embodiments, the first material may not need to be a stressor material. For example, the first crystalline material may not serve as a stressor. The first material merely comprises a material which can be selectively removed with respect to the second material.

Figure 10C:
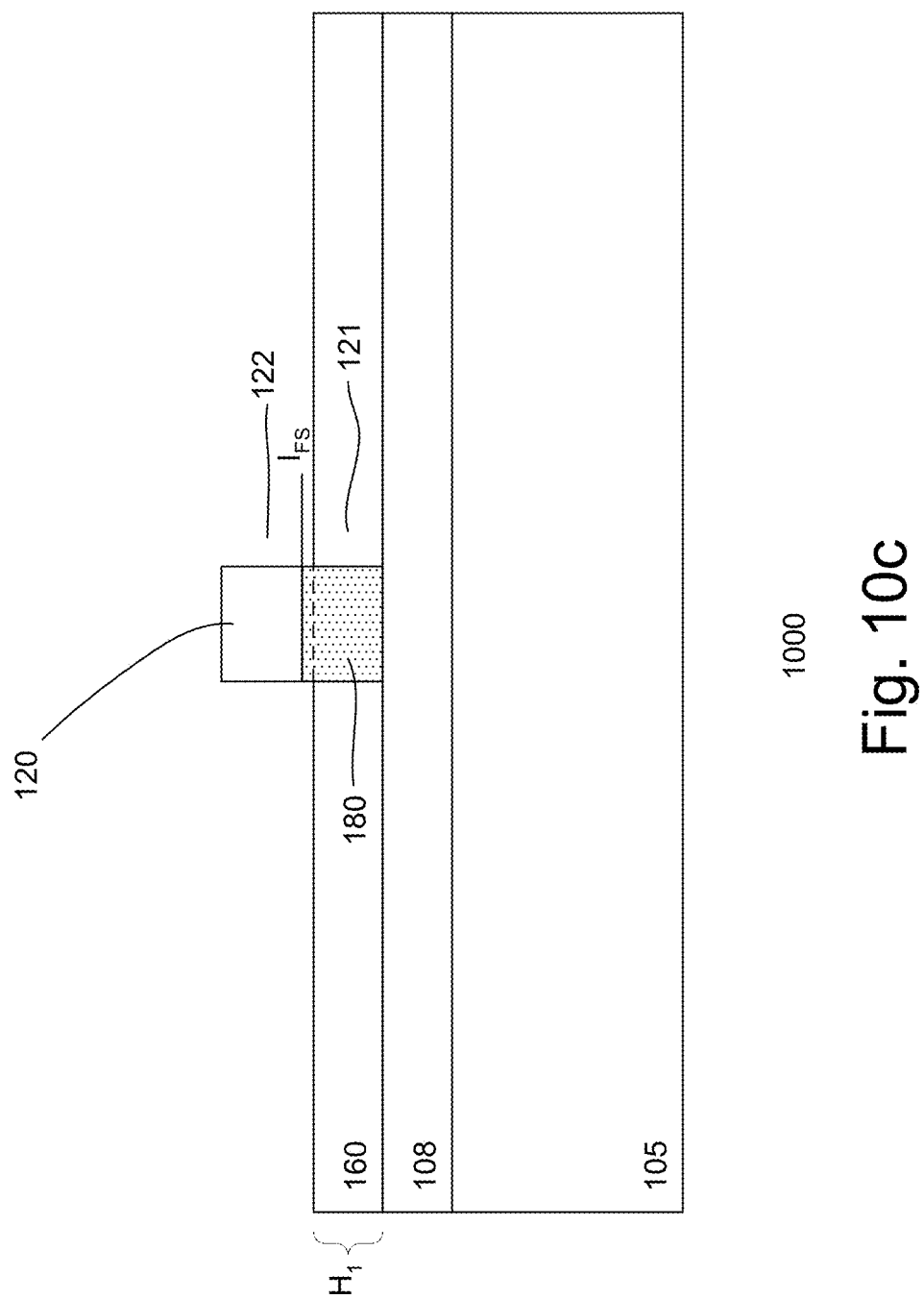

In FIG. 10c, the second dielectric layer is removed selectively to the first dielectric layer, as similarly described in FIG. 7e. As shown, the first material is partially disposed above the top surface of the first dielectric layer.

Figure 10D:
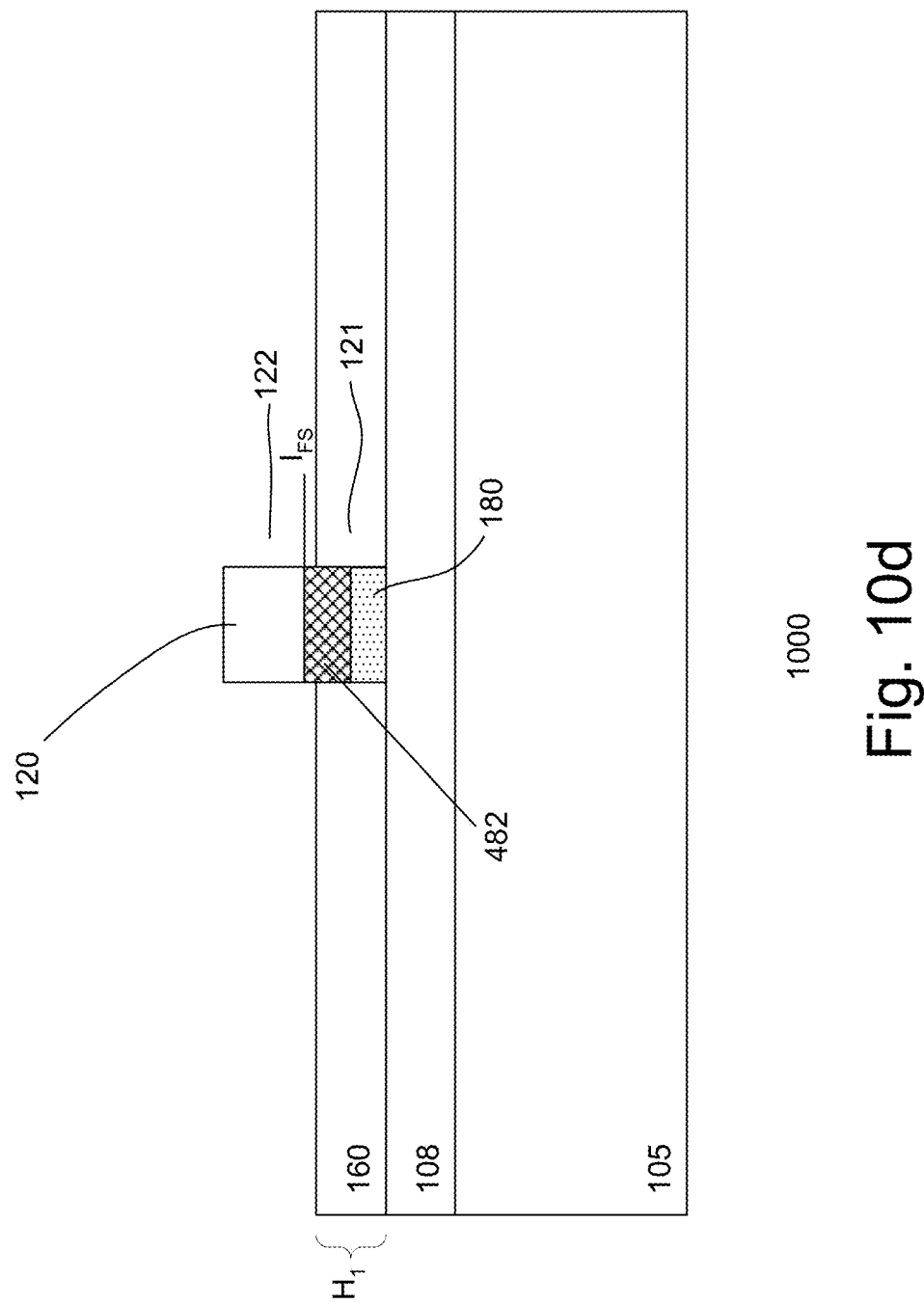

Referring to FIG. 10d, an isotropic etch is performed. The isotropic etch for example, selectively removes the first material with respect to the dielectric layer and the second material of the second portion of the fin structure. For example, the isotropic etch removes a part of the first portion of the fin structure. In one embodiment, the isotropic etch comprises a wet etch. Other types of isotropic etches may also be useful. As shown, the etch removes an upper part of the first material in the fin structure. This forms a void 482 in the upper part of the first portion of the fin structure.

Since the S/D contact regions at the ends of the fin structure are wider than the mid portion of the fin structure, the first material is not completely removed, leaving them to serve as a support structure to suspend the second material over the first material, as described in, for example, FIG. 4d.

Figure 10E:
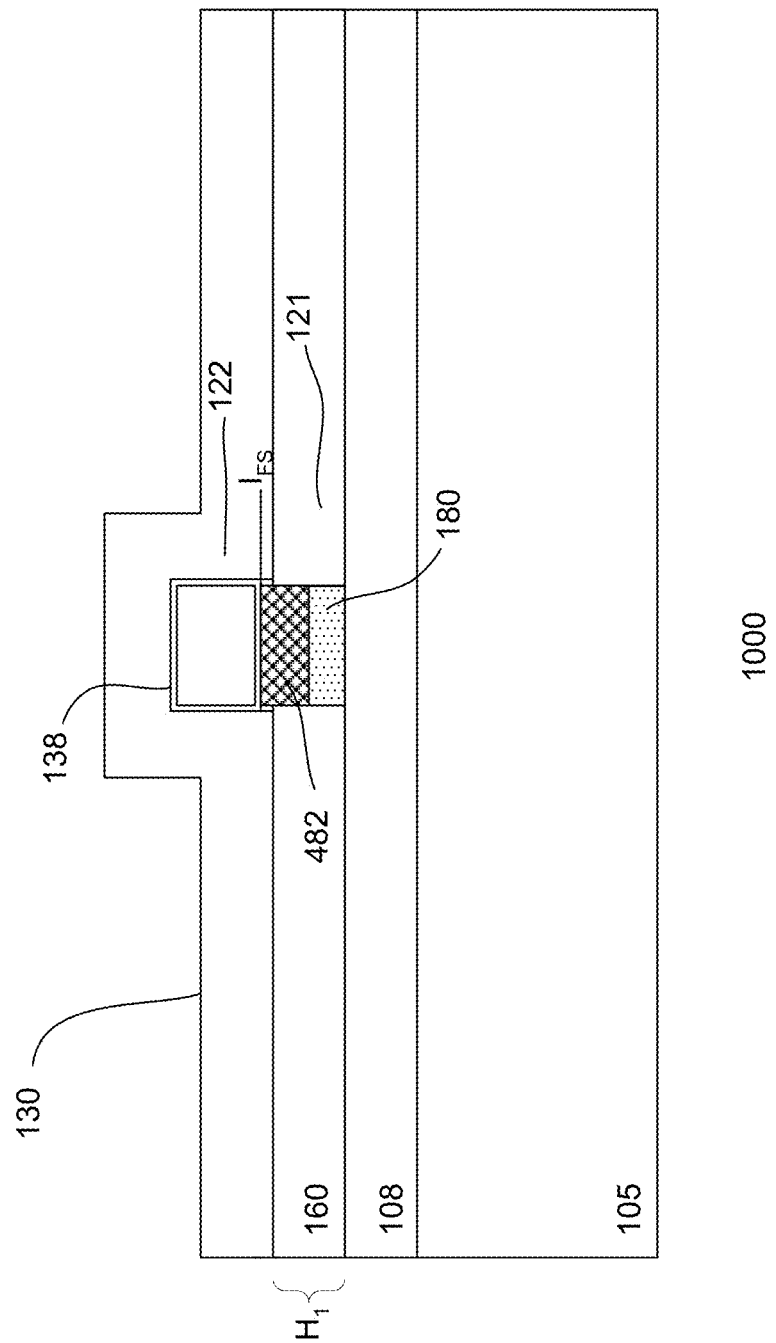

In FIG. 10e, the process continues to form a gate electrode 130 over the surface of the dielectric layer 160 and fin structure 120, with a gate oxide layer 138 separating the fin structure, similar as described in FIGS. 7f-g. Since the bottom of the second portion is exposed, the gate oxide layer also forms there.

In other embodiments, the first material of the first portion of the fin structure may be removed to form a void 482, as shown in FIG. 4e. As such, the void 482 exists between the second portion of the fin structure and the substrate. This forms a SON device. Alternatively, the first portion may be partially removed to form a partial void 482 between the first and second portions of the fin structure, as shown in FIG. 4f. For example, a post may be provided in a central portion of an upper portion of the first portion of the fin structure. Other configurations of the void and first and second portions of the fin structure may also be useful.

The process may continue, as previously described to complete the device. In some embodiments, the fin structure 120 may be formed with S/D or embedded S/D stressors, as described in FIGS. 8a-d. In other embodiment, a counter doped well and/or counter doped region may be provided, as previously described. Other combinations of a buried stressor, S/D or embedded S/D stressors, a counter doped region and counter doped well may also be useful.

Figure 11A:
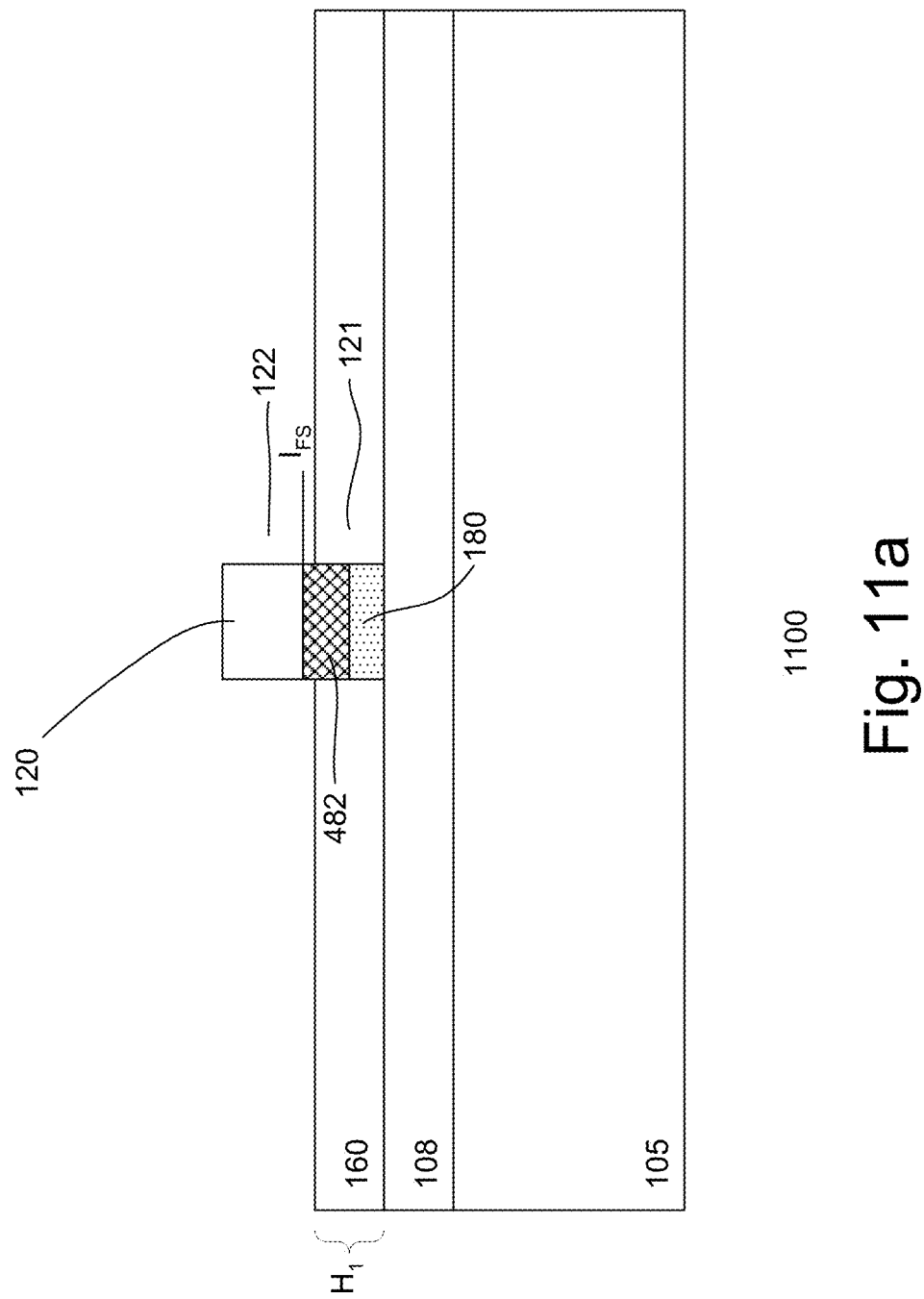
FIGS. 11a-b show cross-sectional views of yet another embodiment of a process for forming a device.
Figure 11B:
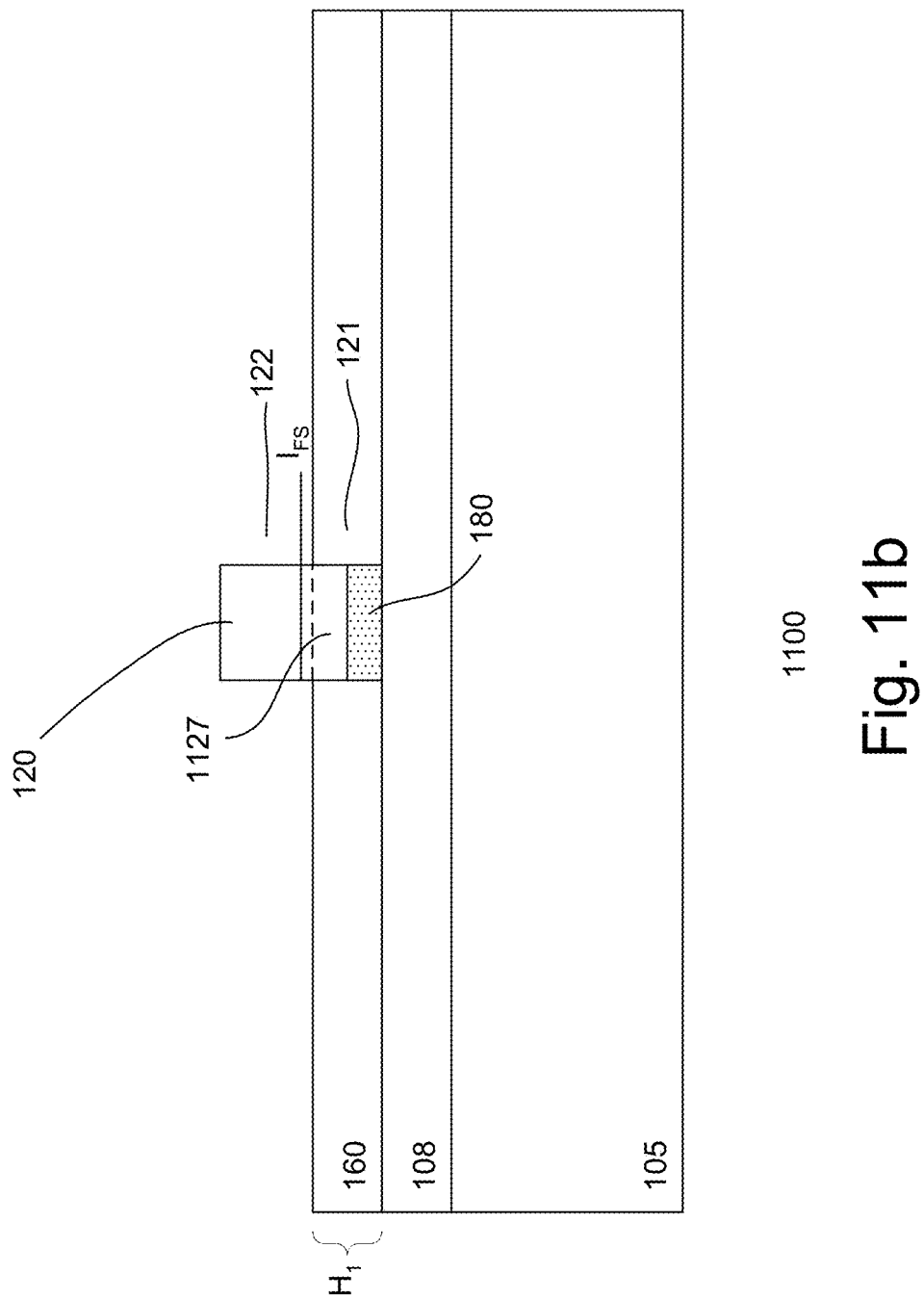

FIGS. 11a-b show cross-sectional views of another embodiment of a process 1100 for forming a device or IC. The cross-sectional views may be along B-B'. Referring to FIG. 11a, a partially processed substrate 105 is provided. The substrate is at a stage of processing as described in FIG. 10d. As such, the common features need not be discussed. For example, the fin structure 120 includes a void 482 provided between the second material in the upper portion 122 and a remaining lower part of the first portion of the fin structure.

In other embodiments, the first material of the first portion of the fin structure may be removed or partially removed to form a void or partial void, as shown in FIGS. 4e-f.

In FIG. 11b, the void 482 is filled with a dielectric material 1127. For example, the void is filled with silicon oxide. Other types of dielectric materials may also be useful. The dielectric material may fill the void by, for example, HDCVD or PECVD. A reflow process may be performed to ensure that the dielectric material fills the void. For example, during reflow, the dielectric material flows into the void. An etch may be employed to remove excess dielectric material. In some embodiments, the dielectric material used to fill the void may be removed selectively to the dielectric layer 160. Other techniques of filling the void and removing excess materials may also be useful.

The process continues to form the device, for example, as described from FIG. 10e and onwards. In some embodiments, the fin structure 120 may be formed with S/D or embedded S/D stressors, as described in FIGS. 8a-d. In other embodiment, a counter doped well and/or counter doped region may be provided, as previously described. Other combinations of a buried stressor, S/D or embedded S/D stressors, a counter doped region and counter doped well may also be useful.

Figure 12A:
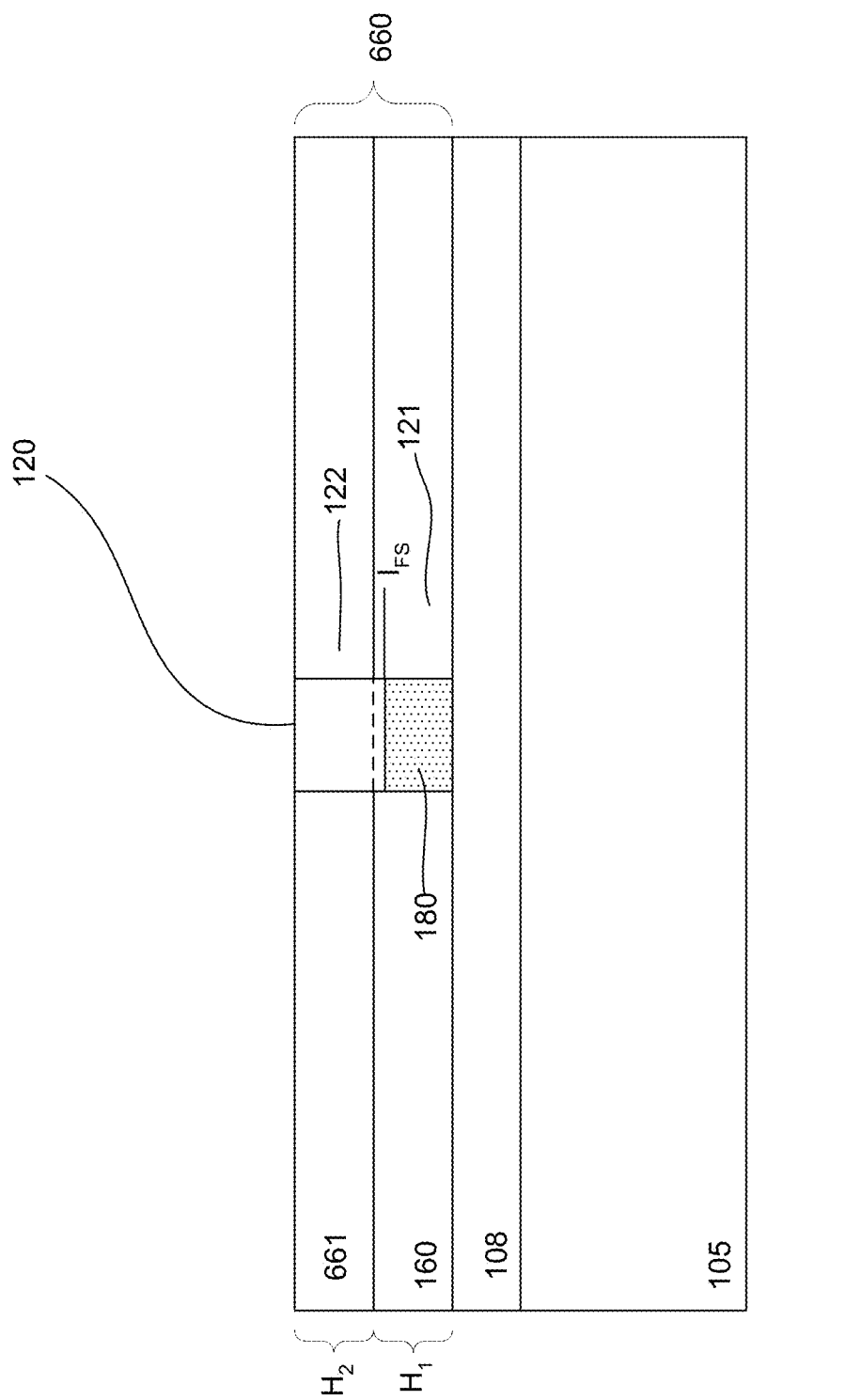
FIGS. 12a-c show cross-sectional views of another embodiment of a process for forming a device.
Figure 12B:
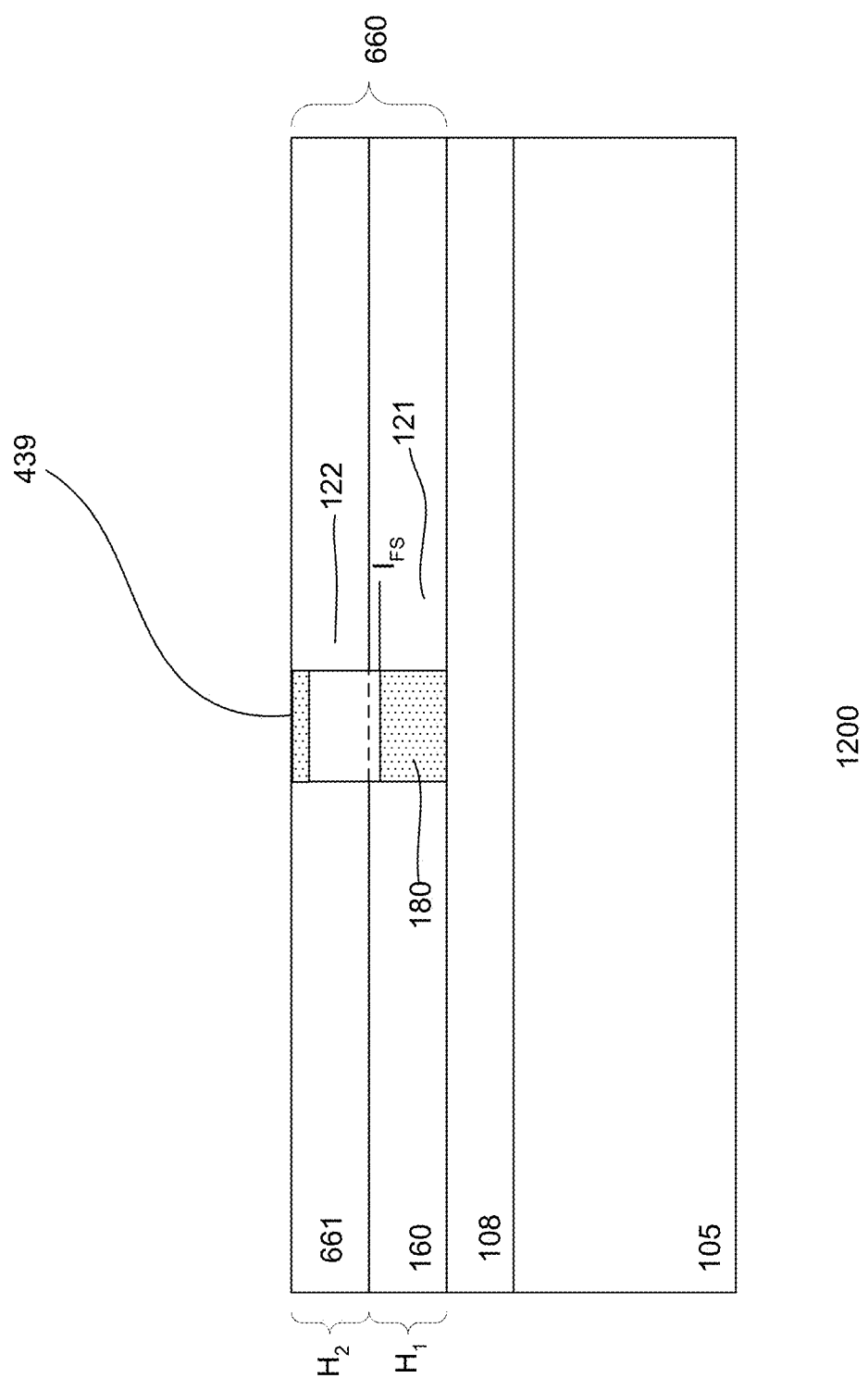
Figure 12C:
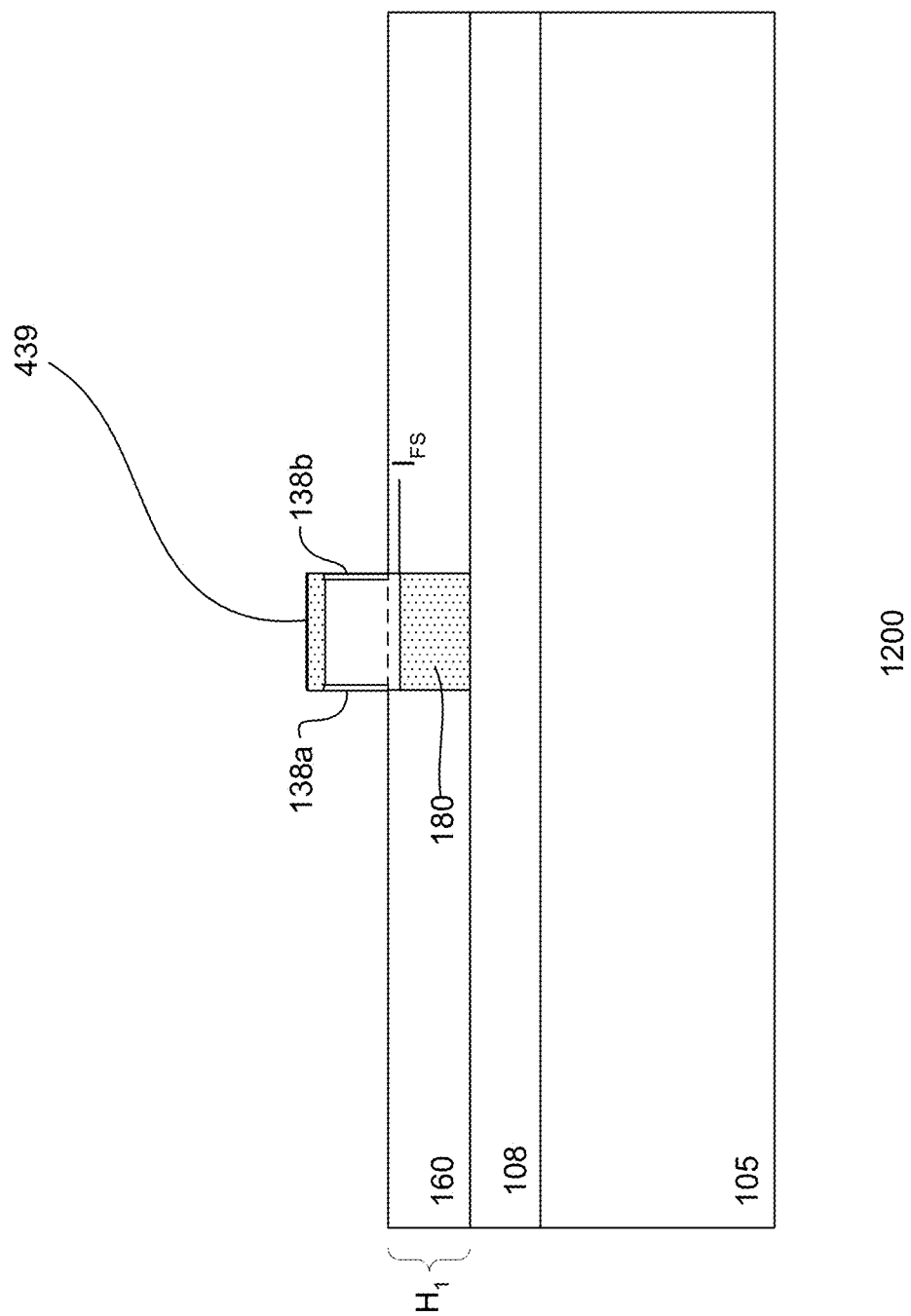

FIGS. 12a-c show cross-sectional views of an embodiment of a process 1200 for forming a device or IC. Referring to FIG. 12a, a partially processed substrate 105 is provided. The substrate is at a stage of processing as described in FIG. 7d. As such, the common features need not be discussed. For example, the substrate is prepared with a dielectric stack 660 having a fin structure 120 formed in an opening 668. The fin structure may include S/D contact pads.

In FIG. 12b, a dielectric hard mask 439 is formed on an upper portion of the fin structure 120. In one embodiment, the hard mask is formed by, for example, thermal oxidation. The thickness of the hard mask is sufficient to prevent tunneling effect to isolate a portion of the gate over the top surface of the structure from the top surface of the fin structure. The hard mask, for example, is about 20-50 nm thick. Other thicknesses may also be useful. In one embodiment, the hard mask is formed by oxidizing a top surface of the fin structure and the contact pads. For example, an anneal in an oxidizing ambient is performed. The anneal, for example, is performed at a temperature of about 900° C. in $O_2$ ambient. Other types of hard mask or techniques for forming the hard mask on the top surface of the fin structure are also useful. For example, the hard mask may be formed by depositing a hard mask material on the dielectric layer in which the fin structure includes a recess below the top surface of the dielectric layer. The recess may be formed by SEG or by over-polishing the fin structure. Excess hard mask material may be removed by polishing, leaving the hard mask above the fin structure.

In FIG. 12c, the second dielectric sub-layer 661 is removed, leaving the first dielectric sub-layer 160 on the substrate. Removing the second dielectric sub-layer selective to the first dielectric sub-layer may be achieved by, for example, a wet etch. Other type of techniques, such as RIE, may also be employed to selectively remove the second dielectric sub-layer. An anneal may be optionally performed after removing the second dielectric sub-layer. The anneal, for example, is performed in a hydrogen ($H_2$) ambient to smoothen the fin structure and passivate dangling bonds. Other types of anneals may also be useful.

Gate oxide layers 138a-b are formed on exposed sidewalls of the fin structure, including the contact pads. The gate oxide layers, for example, comprise silicon oxide. In one embodiment, the gate oxide layers are formed by annealing the substrate in an oxidizing ambient, such as $O_2$. This forms thermal silicon oxide layers on the sidewalls of the fin structure. Forming other types of gate oxides or using other techniques to form the gate oxide may also be useful. The thickness of the gate oxide layer may be about, for example, 0.6-3 nm. Other thicknesses for the gate oxide may also be useful.

The process continues to form the device, as described from FIG. 7f and onwards. By providing a hard mask on the top surface of the fin structure, a dual gate finFET is provided. This, for example, advantageously enables designers to have greater latitude in designing the fin structures with different widths and height.

In some embodiments, the hard mask may be incorporated in the processes as described in FIGS. 8a-d, 9a-b, 10a-e, and 11a-b.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a substrate prepared with a dielectric layer on its top surface,
      wherein the dielectric layer comprises a non-selectively etched dielectric top surface;
   a fin structure
      disposed on the substrate in the dielectric layer,
      wherein the fin structure includes a bottom portion and a top portion,
         the top portion extending above the non-selectively etched dielectric top surface,
         wherein
         the top portion determines a device height and
         the non-selectively etched top surface reduces height variations of fin structures across the wafer;
   a gate traversing the fin structure;
   S/D regions in the fin structure adjacent to the gate;
   a channel between the S/D regions below the gate; and
   a first stressor to cause the channel to have a first strain to improve carrier mobility;
      wherein the fin structure comprises a first portion and a second portion above the first portion; and
      a void
         partially beneath the gate and
         separating the first and second portions of the fin structure.

2. The device of claim 1
   wherein the first stressor is disposed in the first portion of the fin structure to cause the channel to have the first strain from below the channel.

3. The device of claim 1 wherein the first stressor comprises S/D stressors disposed on the S/D regions to cause the channel to have the first strain from above the channel.

4. The device of claim 1 wherein the first stressor comprises embedded raised S/D stressors disposed in recesses in the S/D regions to cause the channel to have the first strain from adjacent and above the channel.

5. The device of claim 1 wherein:
the first portion of the fin structure comprises a lower part and an upper part; and
the void is disposed in the upper part of the first portion of the fin structure and
extends across a width of the fin structure, separating the lower part and the second portion of the fin structure.

6. The device of claim 1 wherein:
the first portion of the fin structure comprises a lower part and an upper part; and
the void
is disposed in a part of the upper part of the first portion of the fin structure and
does not extend across a width of the fin structure.

7. The device of claim 1 wherein:
the void is disposed in a part of the first portion of the fin structure and
the void does not cut across a complete width of the first portion of the fin structure.

8. The device of claim 1
wherein the first stressor comprises S/D stressors disposed on the S/D regions to cause the channel to have the first strain from above the channel.

9. The device of claim 1
wherein the first stressor comprises embedded raised S/D stressors disposed in recesses in the S/D regions to cause the channel to have the first strain from adjacent and above the channel.

10. The device of claim 1 wherein the void is disposed in the first portion of the fin structure.

11. The device of claim 1 further comprising a counter doped well which is disposed below the fin structure.

12. The device of claim 1 further comprising a hard mask layer disposed over a top surface of the fin structure.

13. A device comprising:
a substrate prepared with a dielectric layer on its top surface;
a fin structure
disposed on the substrate in the dielectric layer,
wherein the fin structure includes a bottom portion and a top portion,
the top portion extending above the dielectric top surface,
wherein
the top portion determines a device height and
the top surface reduces height variations of fin structures across the wafer;
a gate traversing the fin structure;
S/D regions in the fin structure adjacent to the gate;
a channel between the S/D regions below the gate; and
a first stressor to cause the channel to have a first strain to improve carrier mobility;
wherein the fin structure comprises a first portion and a second portion above the first portion; and
a void
partially beneath the gate and
separating the first and second portions of the fin structure.

14. A device comprising:
a substrate prepared with a dielectric layer on its top surface;
a fin structure
disposed on the substrate in the dielectric layer,
wherein the fin structure includes a bottom portion and a top portion,
the top portion extending above the dielectric top surface,
wherein
the top portion determines a device height and
the top surface reduces height variations of fin structures across the wafer;
a gate traversing the fin structure;
S/D regions in the fin structure adjacent to the gate;
a channel between the S/D regions below the gate; and
a first stressor
to cause the channel to have a first strain to improve carrier mobility, wherein the fin structure comprises
a first portion and a second portion above the first portion; and
a void
partially beneath the gate and
separating the first and second portions of the fin structure.

* * * * *